(12) United States Patent
Kumar et al.

(10) Patent No.: US 10,409,053 B1
(45) Date of Patent: Sep. 10, 2019

(54) APPARATUS AND METHOD FOR REDUCING POWER CONSUMPTION DURING DISPLAY DRIVING

(71) Applicant: AMAZON TECHNOLOGIES, INC., Seattle, WA (US)

(72) Inventors: Abhishek Kumar, Tilburg (NL); Steven Ramos Carneiro, Eindhoven (NL); Toru Sakai, Waalre (NL)

(73) Assignee: Amazon Technologies, Inc., Seattle, WA (US)

( * ) Notice: Subject to any disclaimer, the term of this patent is extended or adjusted under 35 U.S.C. 154(b) by 387 days.

(21) Appl. No.: 15/188,535

(22) Filed: Jun. 21, 2016

(51) Int. Cl.
*G09G 3/34* (2006.01)
*G02B 26/00* (2006.01)
*H01L 29/66* (2006.01)

(52) U.S. Cl.
CPC ......... *G02B 26/005* (2013.01); *G09G 3/348* (2013.01); *H01L 29/66742* (2013.01); *G09G 2300/0426* (2013.01); *G09G 2310/08* (2013.01); *G09G 2330/021* (2013.01)

(58) Field of Classification Search
CPC ....................................... G09G 2360/145–148
See application file for complete search history.

(56) References Cited

U.S. PATENT DOCUMENTS

2008/0158137 A1* 7/2008 Yoshida ............... G09G 3/3413
345/102
2014/0362000 A1* 12/2014 Seo ..................... G02F 1/13394
345/173

* cited by examiner

*Primary Examiner* — William Boddie
*Assistant Examiner* — Jeffrey Parker
(74) *Attorney, Agent, or Firm* — EIP US LLP

(57) ABSTRACT

An electrowetting display device includes a first support plate and an opposing second support plate and an electrowetting pixel region between the first support plate and the second support plate. A thin film transistor (TFT) structure is over the first support plate and associated with the electrowetting pixel region. The TFT structure includes a first metal layer over the first support plate. The first metal layer includes a gate and a reflective metal portion. A semiconductor layer is over the gate. A dielectric layer is on the first metal layer. The dielectric layer includes a first contact hole extending along at least a portion of a length of the dielectric layer. A light sensing element is disposed over the dielectric layer and in ohmic contact with the reflective metal portion.

8 Claims, 9 Drawing Sheets

APPARATUS AND METHOD FOR REDUCING POWER CONSUMPTION DURING DISPLAY DRIVING

BACKGROUND

Many portable electronic devices include displays for displaying various types of images. Examples of such displays include electrowetting displays (EWDs), liquid crystal displays (LCDs), electrophoretic displays (EPDs), light emitting diode displays (LED displays), etc. In EWD applications, an addressing scheme is utilized to drive the pixels of the EWD. Generally, one of the points of emphasis for EWD applications is low power design since in today's applications EWDs are often intended to be used in mobile and portable media devices.

An input video or data-stream generally represents a sequence of pixel display values, grouped per line; a sequence of lines, grouped per frame; and a sequence of frames defining a frame sequence. When such a data stream is to be reproduced on an active matrix EWD, a timing controller and display drivers are used to process the incoming data stream and to control the state of the actual pixels of the EWD. A specific addressing scheme is used by the timing controller to timely control source and gate drivers of the EWD. The purpose of an addressing scheme is to set (or maintain) the state of a pixel. The addressing scheme drives an active matrix transistor array and provides analog voltages to individual pixels of the EWD. These voltages modulate the brightness of the pixels of the EWD. The pixels are grouped per row and when a row is addressed, voltages of a complete row are stored as charge on corresponding pixel capacitors. As the display data is repeatedly updated, still and moving images can be reproduced by the EWD.

When driving the pixels of a display, various components operate according to a drive scheme. In conventional devices these drive schemes are usually created in an ad hoc manner, oftentimes in a lab setting, and are fixed for a particular device.

BRIEF DESCRIPTION OF THE DRAWINGS

The detailed description is set forth with reference to the accompanying figures. The use of the same reference numbers in different figures indicates similar or identical items or features.

DETAILED DESCRIPTION

Figure 1:
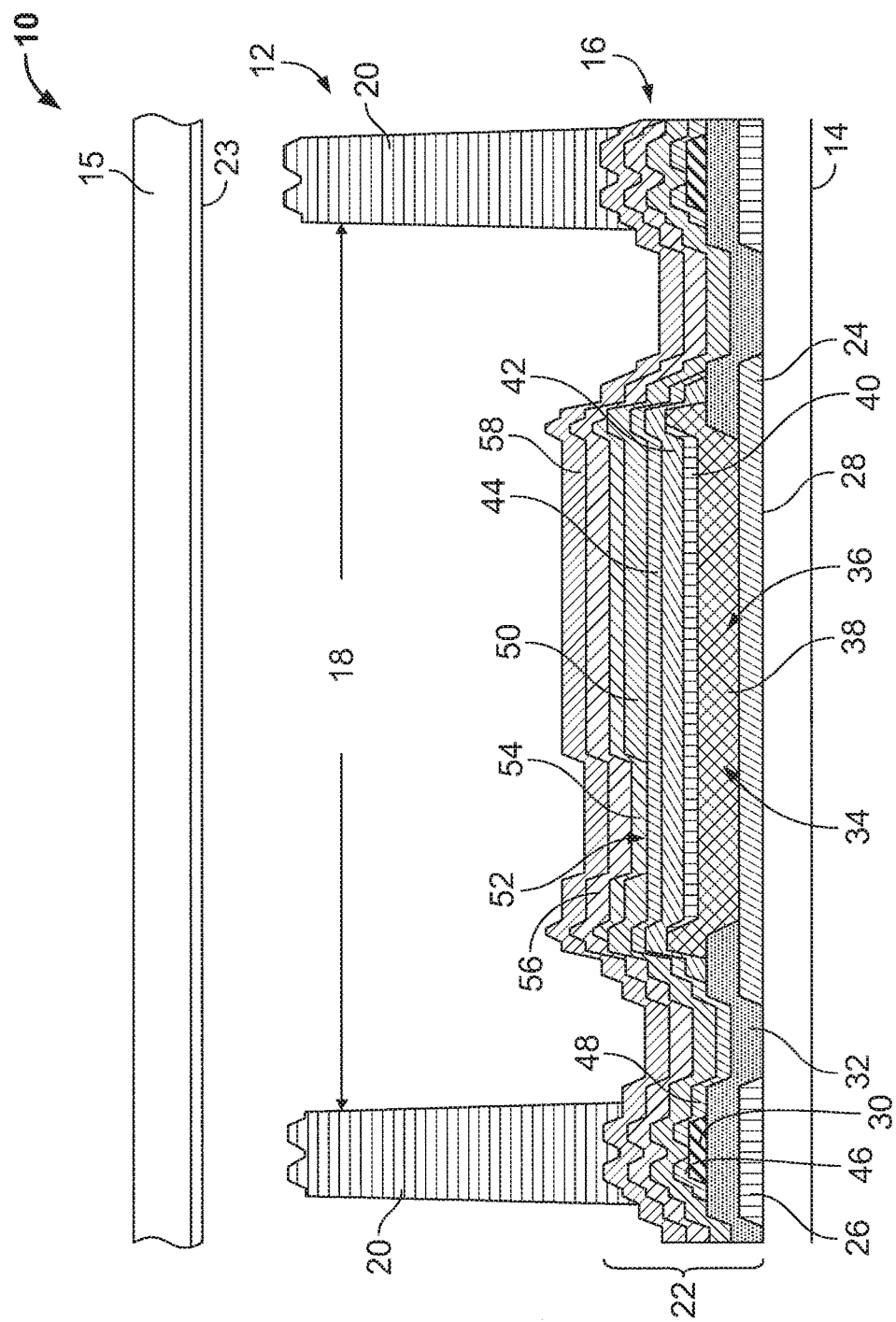
FIG. 1 is a cross-sectional view of an example electrowetting pixel, according to various embodiments.

In example embodiments described herein, an electrowetting display device includes a thin film transistor (TFT) structure over a first support plate. The TFT structure includes a first metal layer over the first support plate. The first metal layer includes a gate and a reflective metal portion. A first passivation layer, such as a dielectric layer, made of a suitable material such as silicon nitride is disposed on the first metal layer and a semiconductor layer is disposed on the dielectric layer over the gate. One or more contact holes are formed through a thickness of the dielectric layer. Each contact hole extends along at least a portion of a length of the dielectric layer. A light sensing element, e.g., a photodiode, is disposed over the dielectric layer such that the light sensing element is disposed over a corresponding contact hole of the one or more contact holes. The light sensing element extends along at least a portion of the length of the dielectric layer. As described below, in certain example embodiments, the one or more light sensing elements are formed in strips; however, the light sensing elements may have any suitable shape, such as a rectangular, circular, oval, or another polygonal or curved shape. In example embodiments, the light sensing element includes an amorphous silicon layer disposed over the corresponding contact hole and a transparent metal layer, such as an indium tin oxide (ITO) layer disposed over the amorphous silicon layer. The transparent metal layer forms a top electrode of the light sensing element. A second passivation layer, e.g., a silicon nitride layer, is disposed over the reflective metal layer and the top electrode and a transparent second metal layer, such as a transparent second ITO layer, is disposed on the semiconductor layer and the second passivation layer. The second metal layer includes a source and a drain. A third passivation layer, e.g., a silicon nitride layer, is disposed on the second metal layer and a second contact hole extends through the third passivation layer. A transparent pixel electrode is disposed on the third passivation layer over the drain. The transparent pixel electrode extends through the second contact hole to electrically couple to the drain of the transparent second metal layer.

In example embodiments, the light sensing element is configured to generate a photocurrent between the transparent metal layer, i.e., the top electrode of the light sensing element, and the reflective metal portion corresponding to an amount of light incident on the light sensing element. A timing controller coupled to the light sensing element is configured to receive a photocurrent signal representative of the photocurrent generated by the light sensing element. The timing controller then determines that a value of the photocurrent signal is below a threshold value or outside of an acceptable range, for example, and initiates a reset process on the electrowetting pixel region responsive to determining that the value of the photocurrent signal is outside the acceptable range. During the reset process, the timing controller applies a reset signal to the electrowetting pixel region to recharge the electrowetting pixel region with one or more display data values, wherein a liquid, e.g., an opaque oil, in the electrowetting pixel region moves to an activated location to expose at least a portion of the light sensing element.

Referring now to the figures, FIG. 1 is a cross-sectional view of a portion of an example display device, such as a reflective electrowetting display device 10, illustrating a portion of an electrowetting pixel region 12 positioned between a first or bottom support plate 14 and a second or top support plate 15 opposing bottom support plate 14. Pixel region 12 includes an electrowetting pixel 16 or an electrowetting sub-pixel formed over bottom support plate 14 to define display surface area 18, as shown in FIG. 1. A plurality of pixel wall portions 20 is formed over first support plate 14 to form a perimeter of electrowetting pixel region 12. Reflective electrowetting display device 10 includes a thin film transistor (TFT) structure 22 disposed, e.g., formed over first support plate 14. TFT structure 22 is operatively coupled to a common electrode 23 positioned under top support plate 15 for creating, in conjunction with common electrode 23, a voltage differential between TFT structure 22 and common electrode 23 to cause displacement of a first fluid, e.g., a first liquid such as an electrowetting oil, not shown in FIG. 1 for clarity, within electrowetting pixel 16.

TFT structure 22 includes a first metal layer 24, e.g., an electrode layer or gate electrode layer that includes a gate 26 and a reflective metal portion 28, disposed on or over first support plate 14. In example embodiments, gate 26 is made of any suitable metal or alloy material, such as molybdenum metal or a molybdenum alloy. In certain embodiments, reflective metal portion 28 is formed or made of any suitable materials including, for example, a metal (90%, 95% or greater than 95% metal), an alloy, a doped metal, or a dielectric reflective material. Suitable metal materials for reflective metal portion 28 include, without limitation, aluminum, silver, gold, copper, nickel, platinum, rhodium, lanthanum, and/or silicon nickel. Suitable alloy materials for reflective metal portion 28 include, without limitation, aluminum with copper or aluminum with nickel. In further alternative embodiments, reflective metal portion 28 is made of any suitable material providing a desired specular reflectance. In alternative embodiments, reflective metal portion 28 includes a suitable diffuse reflective material deposited on or over first metal layer 24. In this alternative embodiment, any suitable diffuse reflective material, such as titanium dioxide ($TiO_2$), providing a desired diffuse reflectance may be used.

TFT structure 22 is coupled in signal communication with associated electrowetting pixel 16 within electrowetting pixel region 12. In the example embodiment, TFT structure 22 is switched to either select (activate) or deselect (deactivate) associated electrowetting pixel 16 using active matrix addressing, for example. TFT structure 22 includes a semiconductor layer 30, e.g., a semiconductor layer including an active amorphous silicon, disposed over gate 26. In example embodiments, semiconductor layer 30 is formed on or over, e.g., deposited on, a suitable non-conducting first passivation layer 32, such as a dielectric layer, which may include a silicon nitride layer, for example. First passivation layer 32 is disposed over gate 26 and reflective metal portion 28 and includes one or more, e.g., a plurality of contact holes 34. Each contact hole 34 extends through a thickness of first passivation layer 32 and along at least a portion of a length of first passivation layer 32. One or more, e.g., a plurality of, light sensing elements 36 are disposed over first passivation layer 32. In example embodiments, each light sensing element 36 includes one or more photodiodes configured to generate a photocurrent between a top electrode of light sensing element 36, as described below, and reflective metal portion 28 corresponding to an amount of light incident on the photodiode. Alternatively or in addition, light sensing elements 36 may include any suitable element or component configured to sense or detect incident light known to those skilled in the art. In certain example embodiments, light sensing elements 36 are formed in strips; however, light sensing elements 36 may have any suitable shape, such as a rectangular, circular, oval, or another polygonal or curved shape. In example embodiments, each light sensing element 36 includes an active amorphous silicon layer 38 including, for example, an n-type amorphous silicon material. In a particular embodiment, active amorphous silicon layer 38 has a thickness substantially equal to a thickness of semiconductor layer 30. Each light sensing element 36 is disposed in or over a corresponding contact hole 34 and extends along at least a portion of the length of first passivation layer 32. Light sensing element 36 has a suitable width and a suitable length to substantially cover corresponding contact hole 34; however, in certain embodiments, one or more dimensions of contact hole 34 is maximized to ensure proper ohmic contact between reflective metal portion 28 of first metal layer 24 and light sensing island strip 36. Each light sensing element 36 also includes a transparent metal layer 40, such as an indium tin oxide (ITO) layer, disposed over amorphous silicon layer 38. Transparent metal layer 40 acts as a top electrode of light sensing element 36. In example embodiments, transparent metal layer 40 forms a photodiode with a cathode coupled to reflective metal portion 28. A bias is applied to transparent metal layer 40 in reference to a voltage applied to reflective metal portion 28 such that photodiode (e.g., light sensing element 36) operates in a reverse bias. A current can be sensed (e.g., converted into a voltage and sensed) flowing through light sensing element 36 between transparent metal layer 40 and reflective metal portion 28 in relation to (e.g., proportionate to) the amount of light that is incident on light sensing element 36. In various embodiments, as discussed below, the photodiode effect of light sensing elements 36 can be used to determine whether backflow of opaque oil within electrowetting pixel region 12 has occurred, which can, in turn, be used to determine whether a pixel reset process is required. In an electrowetting display, generally "backflow" is a tendency of the fluids within an electrowetting pixel, even when subjected to constant electrostatic forces, to return to their original resting condition. This tendency may cause the electrowetting pixel to gradually reduce its light throughput over time as the first fluid returns to its resting position covering the entire pixel. For example, "backflow" may refer to subsequent movement of the opaque oil from a side or a corner, for example, of the associated pixel toward an original resting position covering the display surface area of the associated pixel after the associated pixel has been activated. As described herein, as the opaque oil flows toward the resting position, the opaque oil covers at least a portion of the light sensing element, preventing light from impinging on at least a portion of the top surface of the light sensing element. Generally, a "backflow event" occurs when the opaque oil subsequently moves toward the original resting position.

A second passivation layer 42, such as a layer of silicon nitride, is disposed over reflective metal portion 28 and transparent metal strip 40. In an example embodiment, second passivation layer 42 is initially deposited over first metal layer 24 and a portion of second passivation layer 42 deposited over gate 26 is removed using a suitable patterning process. Second passivation layer 42 isolates the top electrode formed by transparent metal layer 40 from a pixel electrode, as described below, disposed over light sensing element 36. The deposition of second passivation layer 42 does not change a dielectric constant requirement for the layers disposed over second passivation layer 42.

A transparent second metal layer 44 is disposed, e.g., formed on second passivation layer 42 and at least a portion of semiconductor layer 30. Second metal layer 44 forms a source 46 and a drain 48 of TFT structure 22. In example embodiments, second metal layer 44 includes a suitable metal material, such as ITO. A third passivation layer 50, e.g., a passivation layer comprising silicon nitride, is formed over second metal layer 44. A contact hole 52 is formed through third passivation layer 50 to electrically couple a transparent metal pixel electrode layer 54, including one or more pixel electrodes associated with a respective electrowetting pixel region, disposed over, e.g., formed on, third passivation layer 50 to drain 48 formed in second metal layer 44 positioned under third passivation layer 50. In example embodiments, pixel electrode layer 54 is electrically coupled to drain 48 of second metal layer 44 and reflective metal portion 28 of first metal layer 24 through second contact hole 52 and first contact hole 34. Pixel electrode layer 54 may include a suitable material, such as ITO.

Referring further to FIG. 1, a dielectric barrier layer 56 may at least partially separate pixel electrode layer 54 from a transparent hydrophobic layer 58, such as an amorphous fluoropolymer layer forming a bottom surface of electrowetting pixel 16, in certain embodiments. For example, dielectric barrier layer 56 may be disposed on, e.g., deposited on, pixel electrode layer 54. Dielectric barrier layer 56 may be formed from various materials including one or more organic material layers or a combination of organic and inorganic material layers. A thickness of the insulating dielectric barrier layer 56 may be less than 2 micrometers and may be less than 1 micrometer; for example, the insulating dielectric barrier layer 56 may be 100 nanometers to 800 nanometers in thickness in certain embodiments. In some embodiments, hydrophobic layer 58 is an amorphous fluoropolymer layer including any suitable fluoropolymer(s), such as AF1600® fluoropolymer, produced by DuPont, based in Wilmington, Del.

In the example embodiment, one or more pixel wall portions 20 form a patterned electrowetting pixel grid over, e.g., on, hydrophobic layer 58. Pixel wall portions 20 may include a photoresist material such as, for example, an epoxy-based negative photoresist material SU-8. The patterned electrowetting pixel grid includes a plurality of rows and a plurality of columns of pixel wall portions 20 that form a perimeter of an array of electrowetting pixel regions 12. Each electrowetting pixel region 12 may have a width and a height in a range of about 50 to 500 micrometers, for example, and, more particularly, in one embodiment, electrowetting pixel regions 20 have a width of 60 micrometers and a height of 120 micrometers.

A first fluid, e.g., a liquid such as an opaque oil, which may have a thickness in a range of about 1.0 micrometer to 10.0 micrometers, for example, overlays hydrophobic layer 58. The first liquid is partitioned by pixel wall portions 20. A second fluid, e.g., a liquid such as an electrolyte solution, overlays the first liquid and, in certain embodiments, at least a portion of pixel wall portions 20. In certain embodiments, as described above, the second liquid may be electrically conductive and/or polar. For example, the second liquid may be water or a water solution, or a salt solution such as a solution of potassium chloride in water or a mixture of water and ethyl alcohol. In certain embodiments, the second liquid is transparent or may be colored. The first liquid is electrically non-conductive and may, for example, be an alkane-like hexadecane or (silicone) oil. As described herein, the second liquid is immiscible with the first liquid. Light transmission through electrowetting pixel region 12 is controlled by the application of an electric potential to electrowetting pixel 16, which results in a movement of the second fluid into electrowetting pixel 16, thereby displacing the first fluid within electrowetting pixel 16, e.g., movement of the first fluid from a resting position or location to an activated position or location.

As described above, hydrophobic layer 58 is arranged on or over bottom support plate 14 to create an electrowetting surface area. The hydrophobic character of hydrophobic layer 58 causes the first liquid to adjoin preferentially to hydrophobic layer 58 because the first liquid has a higher wettability with respect to a top surface of hydrophobic layer 58 than the second liquid in the absence of a voltage. Wettability relates to the relative affinity of a fluid, e.g., a liquid, for the surface of a solid. Wettability increases with increasing affinity, and it may be measured by the contact angle formed between the fluid and the solid and measured internal to the fluid of interest. For example, such a contact angle may increase from relative non-wettability for a contact angle of more than 90° to complete wettability for a contact angle of 0°, in which case the fluid, e.g., the liquid, tends to form a film on the surface of the solid.

Top support plate 15 covers the second liquid and one or more spacers to maintain the second liquid over electrowetting pixel grid. In one embodiment, the spacers are positioned between top support plate 15 and pixel wall portions 20. In example embodiments, the spacer is coupled to and extends from top support plate 15 to contact a contact surface on a first or distal end of one or more corresponding pixel wall portions 20. In certain embodiments, one or more components or layers may be positioned between top support plate 15 and the spacers. In this arrangement, a contact surface of the spacer contacts a contact surface of corresponding pixel wall portion 20 to provide a stable contact joint at an interface between pixel wall portion 20 and the spacer, providing mechanical strength at the interface that is less sensitive to overflow and/or leakage of the first liquid and/or the second liquid contained within the pixel regions. In alternative embodiments, the spacer does not rest on pixel wall portion 20 but is substantially aligned with pixel wall portion 20. This arrangement may allow the spacer to come into contact with pixel wall portion 20 upon a sufficient pressure or force being applied to top support plate 15. Multiple spacers may be interspersed throughout the electrowetting pixel grid. In certain embodiments, one or more color filter layers may be positioned between common electrode 23 and top support plate 15. A seal extends about a perimeter of electrowetting display device 10 to contain the first liquid and the second liquid within the fluid region of the cavity. A voltage applied across, among other things, the second liquid and TFT structure 22 of individual electrowetting pixel regions 12 controls transmittance or reflectance of associated electrowetting pixels 16.

In various embodiments described herein, electronic devices include electrowetting displays (EWDs) for presenting content. In some examples, the electronic devices may include one or more components associated with the electrowetting display, such as a touch sensor component layered atop the electrowetting display for detecting touch inputs, a front light and/or a back light component for lighting the electrowetting display, and/or a cover layer component, which may include anti-glare properties, anti-reflective properties, anti-fingerprint properties, and/or anti-cracking properties, for example.

For a reflective EWD, when the electrowetting pixel is in a resting state (i.e., the closed or off state, with no electric potential applied), the first liquid, e.g., the opaque oil, is distributed throughout the electrowetting pixel to substantially cover a display surface area of the electrowetting pixel. In example embodiments described herein, when the electrowetting pixel is in the resting state (the opaque oil is in a resting position or location), the opaque oil substantially covers the one or more light sensing elements associated with, e.g., positioned in the electrowetting pixel. The first liquid absorbs light and the electrowetting pixel in this condition appears dark, e.g., black, in one embodiment. But when the electric potential is applied, the electrowetting pixel is in an active state (i.e., that at least partially open state—the on state—with an electric potential applied), the second liquid moves within the pixel displacing the first liquid so that the first liquid is no longer distributed throughout the pixel. Light can then enter the electrowetting pixel and impinge upon a surface of a reflective portion or layer, for example, positioned at or near a bottom of the electrowetting pixel region. Light is then reflected by the reflective portion or layer to reflect out of the electrowetting pixel region. In example embodiments described herein, when the electrowetting pixel is in the active state (the opaque oil is in an activated position or location), at least a portion of one or more light sensing elements associated with, e.g., positioned in the electrowetting pixel is exposed to light entering the electrowetting pixel and light impinges upon a surface of the one or more light sensing elements. If the reflective surfaces reflect only a portion of the light spectrum or if color filters are incorporated into the electrowetting pixel structure, the electrowetting pixel may appear to be gray or have color.

A display device, such as an electrowetting display device, may include a transmissive, reflective or transflective display that generally includes an array of pixels (e.g., which may comprise sub-pixels) configured to be operated by an active matrix addressing scheme. For example, rows and columns of electrowetting pixels are operated by controlling voltage levels on a plurality of source lines and gate lines. In this fashion, the display device may produce an image by selecting particular pixels to transmit, reflect or block light. Pixels are addressed (e.g., selected) via rows and columns of the source lines and the gate lines that are electrically connected to transistors (e.g., used as switches) included in each pixel region. Transistors occupy a relatively small fraction of the area of each pixel region to allow light to efficiently pass through (or reflect from) the pixel.

The array of pixel regions is sandwiched between two support plates, such as a first or bottom support plate and an opposing second or top support plate. For example, a bottom support plate in cooperation with a top support plate may contain pixel regions that include an opaque oil, an electrolyte solution and pixel walls between the support plates forming associated pixels within a respective pixel region. The support plates may be made of any suitable material including, without limitation, plastic, glass, quartz, and semiconducting materials, and may be made of a rigid material or a flexible material, for example. The pixel regions include various layers of materials built upon the bottom support plate, e.g., within or under the pixels. One example layer is an amorphous fluoropolymer (AF1600®) with hydrophobic behavior. The pixel walls may be formed on a top surface of the hydrophobic layer. The bottom support plate may be opaque while the top support plate is transparent. Describing a component or material as being "transparent" generally means that the component or the material may transmit a relatively large fraction of the light incident upon it. For example, a transparent material or layer might transmit more than 70% or 80% of the light impinging on its surface, although in other examples a transparent material or structure might transmit a different percentage of incident light. In general, transparent materials or structures need not be perfectly transparent.

Hereinafter, example embodiments include, but are not limited to, reflective electrowetting displays having a clear or transparent top support plate and a bottom support plate, which need not be transparent. In general, "top" and "bottom" may be used to identify opposing support plates of an electrowetting display and do not necessarily refer to a direction referenced to gravity or to a viewing side of the electrowetting display device. In example embodiments, the top support plate is the surface through which pixels of a (reflective) electrowetting display are viewed.

As described above, individual reflective electrowetting pixel regions may include an electrode layer or gate electrode layer containing or coupled to the drive electronics like TFT structures, source lines, and gate lines on the bottom support plate, a reflective metal portion or layer within or over the electrode layer, a pixel electrode over the reflective metal portion or layer, a barrier layer on the pixel electrode, and a hydrophobic layer on the barrier layer. The pixel electrode in principle is close to the liquids in the pixel to minimize power consumption. In one alternative embodiment, a patterned layer of indium tin oxide (ITO) is deposited as the pixel electrode over the electrode layer. Pixel wall portions of each pixel region, the hydrophobic layer, and the transparent top support plate at least partially enclose a liquid region within the cavity that contains the first liquid which is electrically non-conductive, e.g., an opaque oil retained in the individual electrowetting pixels by pixel wall portions, and the second liquid, e.g., an electrolyte solution, that is electrically conductive or polar and may be a water or a salt solution, such as a solution of potassium chloride in water. The second liquid may be transparent or may be colored. The second liquid is immiscible with the first liquid. In general, substances are "immiscible" with one another if the substances do not substantially form a solution, although in a particular embodiment the second liquid might not be perfectly immiscible with the first liquid. In general, an "opaque" liquid is a liquid that appears black to an observer. For example, an opaque liquid strongly absorbs a broad spectrum of wavelengths (e.g., including those of red, green and blue light) in the visible region of electromagnetic radiation appearing black. However, in certain embodiments an opaque liquid may absorb a relatively narrower spectrum of wavelengths in the visible region of electromagnetic radiation and may not appear perfectly black.

In some embodiments, the opaque liquid is a nonpolar electrowetting oil. In certain embodiments, the first liquid may absorb at least a portion of the visible light spectrum. The first liquid may be transmissive for a portion of the visible light spectrum, forming a color filter. For this purpose, the first liquid may be colored by addition of pigment particles or a dye. Alternatively, the first liquid may be black, for example by absorbing substantially all portions of the visible light spectrum, or reflecting. A reflective first liquid may reflect the entire visible light spectrum, making the layer appear white, or a portion of the entire visible light spectrum, making the layer have a color. In example embodiments, the first liquid is black and, therefore, absorbs substantially all portions of an optical light spectrum.

Spacers and edge seals mechanically couple the first support plate with the overlying, opposing second support plate, forming a separation between the first support plate and the second support plate, and contributing to the mechanical integrity of the electrowetting display device. Spacers can be at least partially transparent so as to not hinder throughput of light in the electrowetting display. The transparency of spacers may at least partially depend on the refractive index of the spacer material, which can be similar to or the same as the refractive indices of surrounding media. Spacers may also be chemically inert to surrounding media. Edge seals, for example, disposed along a periphery of an array of electrowetting pixels, may contribute to retaining liquids (e.g., the first liquid and the second liquid) between the first support plate and the overlying second support plate.

In some embodiments, the electrowetting display device as described herein may be incorporated into a system that includes one or more processors and one or more computer memories, which may reside on a control board, for example. Display software may be stored on the one or more memories and may be operable with the one or more processors to modulate light that is received from an outside source (e.g., ambient room light) or out-coupled from a lightguide of the electrowetting display device. For example, display software may include code executable by a processor to modulate optical properties of individual pixels of the electrowetting display device based at least in part on electronic signals representative of static image and/or video data. The code may cause the processor to modulate the optical properties of pixels by controlling electrical signals (e.g., voltages, currents, and fields) on, over, and/or in layers of the electrowetting display device.

Within a display device, a timing controller analyzes an incoming data stream that may describe the images (e.g., graphics and text) to be displayed on the display device. Based upon that analysis, the timing controller controls the state of the display device pixels in order to depict the images appropriately. To control the state of a particular pixel, the timing controller interacts with and controls a source driver and a gate driver using an addressing scheme. Generally, the timing controller will supply both the source driver and the gate driver with data signals indicating that the states of particular pixels within the display device should be set in a particular manner. The source driver and the gate driver will then convert those data signals into a number of different voltages supplied to the particular pixels using various input lines. The voltages are configured to set the particular pixels into the states as specified by the timing controller.

The operations of the timing controller, source driver, gate driver, and other components of the display device are generally managed according to a drive scheme. The drive scheme may establish the frequency at which the timing controller should operate, as well as the manner in which the timing controller processes incoming display data. The driving scheme may also determine the various voltages used by the source driver and the gate driver to control the state of the pixels.

The present disclosure provides embodiments of an example display device in which the display device is described as a reflective display device. It will be understood, however, that the embodiments described herein are equally applicable to transmissive and transflective devices. A pixel region may, unless otherwise specified, comprise a single pixel or sub-pixel or two or more sub-pixels of an electrowetting display device. Such a pixel or sub-pixel may be the smallest light transmissive, reflective or transflective element of a display that is individually operable to directly control an amount of light transmission through and/or reflection from the element. For example, in some implementations, a pixel region may include a red sub-pixel, a green sub-pixel, a blue sub-pixel and a white sub-pixel. In other implementations, a pixel region may include a pixel that is a smallest component, e.g., the pixel region does not include any sub-pixels or is, in fact, a sub-pixel itself.

In general, image display apparatuses, such as, for example, various electronic devices, including, but not limited to, portable computing devices, tablet computers, laptop computers, notebook computers, mobile phones, personal digital assistants (PDAs), and portable media devices (e.g., e-book devices, DVD players, etc.), display images on a display. Examples of such displays include, without limitation, LCDs, EWDs and EPDs.

More particularly, a display device, such as an electrowetting display device, for example, can be a thin film transistor electrowetting display (TFT-EWD) that generally includes an array of transmissive, reflective or transflective pixels or sub-pixels (referred to herein as pixels) configured to be operated by an active matrix addressing scheme. For example, rows and columns of pixels are operated by controlling voltage levels on a plurality of source lines and gate lines. In this fashion, the display device can produce an image by selecting particular pixels to transmit, reflect or block light. Pixels are addressed (e.g., selected) via source lines and gate lines that are connected to transistors (e.g., TFT structures used as switches) in communication with each pixel. Transistors take up a relatively small fraction of the area of each pixel region.

An electrowetting display device employs an applied voltage to change the surface tension of a liquid in relation to a surface. For instance, by applying a voltage to a hydrophobic surface via a pixel electrode in conjunction with a common electrode, the wetting properties of the surface can be modified so that the surface becomes increasingly hydrophilic. Hydrophobic generally refers to repelling water or polar fluids while hydrophilic generally refers to having an affinity for water or polar fluids.

As one example of an electrowetting display, the modification of the surface tension by applying a voltage causes a fluid that includes an electrolyte, i.e., the polar fluid, in an electrowetting liquid in individual pixels of the display to adhere to the modified surface and thus, replace an electrowetting oil layer in individual pixels of the display. Thus, the electrowetting fluids in the individual pixels of the display responding to the change in surface tension act as an optical switch. When the voltage is absent, the electrowetting oil forms a continuous film within a pixel, and the color may thus be visible to a user of the display. On the other hand, when the voltage is applied to the pixel, the electrowetting oil is displaced and the pixel becomes reflective. When multiple pixels of the display are independently activated, the display can present a color or grayscale image. The pixels may form the basis for a transmissive, reflective, or transmissive/reflective (transreflective) display. Further, the pixels may be responsive to high switching speeds (e.g., on the order of several milliseconds), while employing small pixel dimensions. Accordingly, the electrowetting displays herein may be suitable for applications such as displaying video content. In addition, the low power consumption of electrowetting displays in general makes the technology suitable for displaying content on portable display devices that rely on battery power.

For the driving of electrowetting displays, a dedicated gate scanning algorithm is generally implemented. In general, a first write action discharges a pixel to a reset level, e.g., a black level voltage, which is also referred to as a reset of the pixel. A second write action generally charges the pixel to an actual required display data value.

The power consumption of an electrowetting display depends on the electrowetting display's physical properties, as well as image content. The power consumption of an electrowetting display can be modeled as an array of capacitors (corresponding to each of the display's pixels), which are continuously charged and discharged with new image data. The most relevant parameters are capacitive load (of the pixels and the electrowetting display), drive voltage for the pixels, and the addressing rate for the pixels. These parameters determine the rate and charge required to readdress the electrowetting display.

Figure 2:
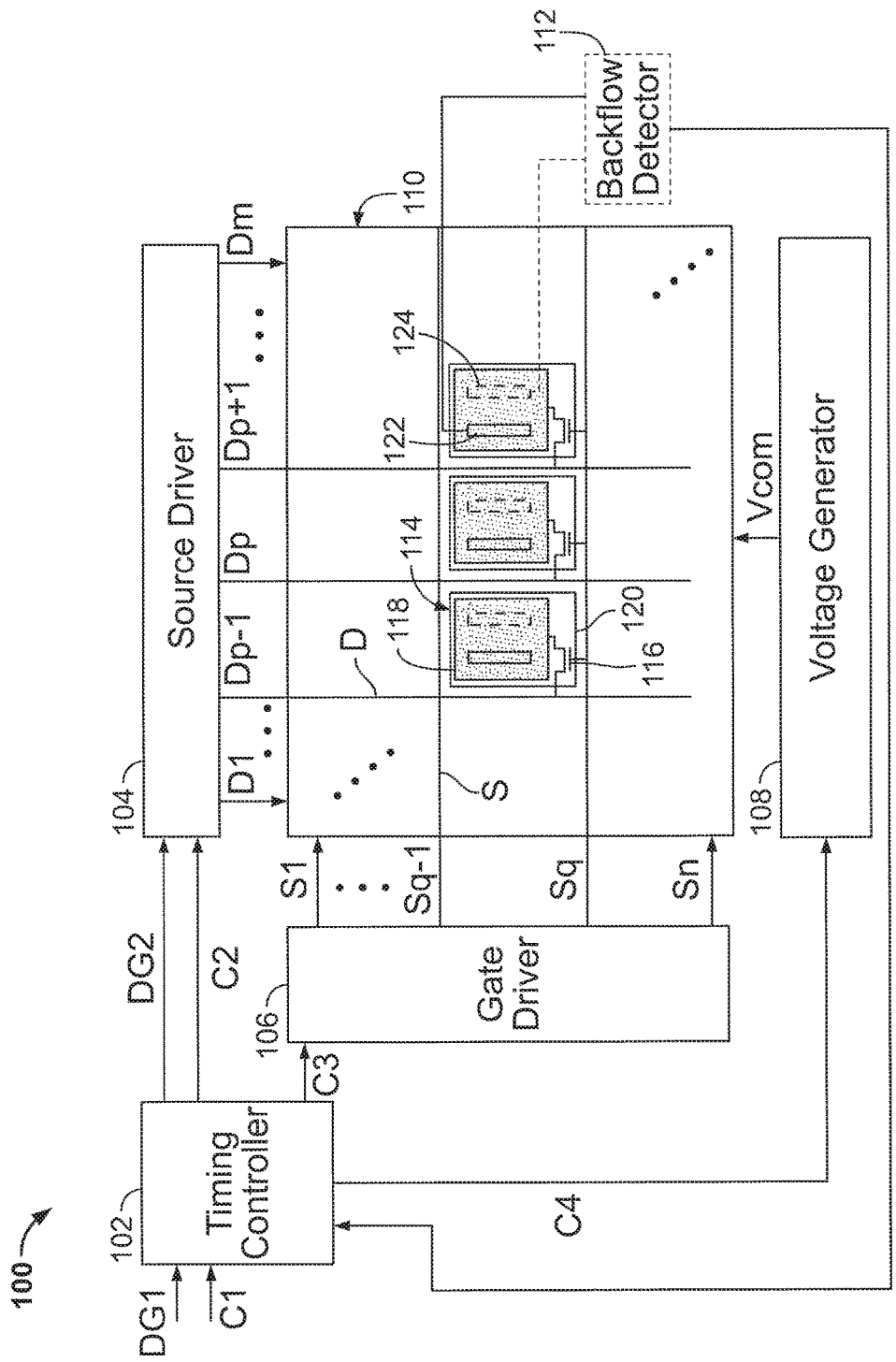
FIG. 2 is a block diagram depicting components of an example electrowetting display device, according to various embodiments.

Referring to FIG. 2, an example electrowetting display device 100 is schematically illustrated that includes a timing controller 102, a source driver (data driver) 104, a gate driver (scan driver) 106, a voltage generator 108, an electrowetting display panel 110, and an optional backflow detector 112. Electrowetting display panel 110 is driven by timing controller 102, source driver 104, gate driver 106 and voltage generator 108. In the present disclosure, timing controller 102, source driver 104, gate driver 106, and voltage generator 108 may collectively be referred to as a pixel control system. In certain embodiments, alternative or additional display components, such as a circuit or the source and/or gate drivers, for example, may perform at least some of the described tasks performed by the timing controller.

As an example of general operation of electrowetting display device 100, responsive to a first data signal DG1 and a first control signal C1 from an external image source, e.g., a graphic controller (not illustrated), timing controller 102 applies a second data signal DG2 and a second control signal C2 to source driver 104; a third control signal C3 to gate driver 106; and a fourth control signal C4 to voltage generator 108.

Source driver 104 converts the second data signal DG2 to voltages, i.e., data signal voltage values, and applies the data signals D1, . . . , Dp−1, Dp, Dp+1, . . . , Dm to electrowetting display panel 110. At an address rate or scan rate, gate driver 106 sequentially applies scan signals S1, . . . , Sq−1, Sq, . . . , Sn to electrowetting display panel 110 in response to the third control signal C3.

Voltage generator 108 applies a common voltage Vcom to electrowetting display panel 110 in response to the fourth control signal C4. Although not illustrated in FIG. 2, voltage generator 108 generates various voltages required by timing controller 102, source driver 104, gate driver 106, and backflow detector 112.

A plurality of pixel regions 114 are positioned adjacent to crossing points of the data lines D and the gate lines S and, thus, are arranged in a grid of rows and columns. Each pixel region 114 includes a hydrophobic surface (not illustrated in FIG. 2), and a thin film transistor (TFT) structure 116 including a pixel electrode 118 under the hydrophobic surface. Each pixel region 114 may also include a storage capacitor (not illustrated) under the hydrophobic surface. A plurality of intersecting partition or pixel wall portions 120 separates pixel regions 114. Pixel regions 114 can include pixels within electrowetting display 100 or sub-pixels within electrowetting display 100, depending upon the application for electrowetting display 100.

Electrowetting display panel 110 includes m data lines D, i.e., source lines, to transmit the data voltages and n gate lines S, i.e., scan lines, to transmit a gate-on signal to TFT structures 116 to control respective pixel regions 114. Thus, timing controller 102 controls source driver 104 and gate driver 106. Timing controller 102 applies a second data signal DG2 and a second control signal C2 to source driver 104; a third control signal C3 to gate driver 106; and a fourth control signal C4 to voltage generator 108 to drive pixel regions 114. Gate driver 106 sequentially applies scan signals S1, . . . , Sq−1, Sq, . . . , Sn to electrowetting display panel 110 in response to the third control signal C3 to activate rows of pixel regions 114 via the gates of TFT structures 114. Source driver 104 converts the second data signal DG2 to voltages, i.e., data signals, and applies the data signals D1, . . . , Dp−1, Dp, Dp+1, . . . , Dm to sources of TFT structures 116 of pixel regions 114 within an activated row of pixel regions 114 to thereby activate (or leave inactive) pixel regions 114.

Timing controller 102 selectively operates at a frequency which, in turn, determines how quickly each row of pixel regions 114 within display panel 110 is addressed. If the operational frequency of timing controller 102 is increased, the rows of pixel regions 114 will be addressed more quickly, thereby increasing the reset rate of display device 100. This, however, will result in an increase in power consumed by timing controller 102 and the other components of display device 100.

In various embodiments, each pixel region 114 includes one or more light sensing elements, for example, a first light sensing element 122 and/or a second light sensing element 124. In particular embodiments, each pixel region 114 may include additional light sensing elements, not shown in FIG. 2. Light sensing elements 122, 124 are ultimately electrically coupled to timing controller 102; however, various components may be included within the coupling between light sensing elements 122, 124 and timing controller 102, as described herein. For example, various components may sense photocurrent produced by light sensing elements 122, 124, transform the sensed photocurrent (e.g., to a voltage level representative of the photocurrent), or amplify the photocurrent. In one embodiment, light sensing elements 122, 124 are coupled to backflow detector 112 which operates to receive and analyze photocurrent signals originating at light sensing elements 122, 124 to determine whether a backflow event has occurred.

For example, if a backflow event occurs, a portion of the opaque oil within the pixel region may move away from its activated location and spread out to cover all or a portion of one, some, or all of light sensing elements 122, 124. In such an instance, the light sensed by light sensing elements 122, 124 will be reduced, resulting in a reduced photocurrent passed through light sensing elements 122, 124, and, in turn, a reduced photocurrent signal. In example embodiments including more than one light sensing element, such as embodiments including first light sensing element 122 and second light sensing element 124, first light sensing element 122 and second light sensing element 124 are located at different locations within pixel region 114. For example, first light sensing element 122 is positioned relatively closer to an activated location of the oil, i.e., a location in associated pixel region 114 where the oil forms a droplet after pixel region 114 is activated, while second light sensing element 124 is positioned farther from the activated location of the oil. In such an arrangement, if oil covers first light sensing element 122, first light sensing element 122 provides a signal indicating that a minor backflow has occurred. However, if oil reaches second light sensing element 124, second light sensing element 124 provides a signal indicating that more extensive backflow has occurred. In various embodiments, timing controller 102 determines based, at least in part, on these different signals from first light sensing element 122 and/or second light sensing element 124 an extent or a severity of oil movement or flow within pixel region 114. Timing controller 102 determines a duration for a reset pulse applied to pixel region 114 to return the oil to the activated location. For example, a longer reset pulse may be required if the oil has sufficiently flowed to reach second light sensing element 124, while a shorter reset pulse may be required if the oil has flowed only to reach first light sensing element 122.

In example embodiments, backflow detector 112 determines that the backflow event has occurred when the reduction in photocurrent signal, for example, falls below a threshold level. In one embodiment, backflow detector 112 converts a received photocurrent signal into a digital representation, for example, with an analog-to-digital converter (ADC) and compares the digital representation to a digital representation of the threshold level (e.g., a digital value representing the threshold level). The digital representation of the threshold level may be a preset value. Further, the digital representation of the threshold level may change, for example, with a sensed light level. In a particular embodiment, display panel 110 includes one or more additional light sensing elements positioned outside an active area of display panel 110 on display device 100 to account for varying light levels. Backflow detector 112 is configured to use the photocurrent signals from the additional light sensing elements as a baseline or a reference level to take into account when determining the digital representation of the threshold level. Additionally or alternatively, the light level analyzed by timing controller 102 to determine one or more characteristics, e.g., a duration, of the reset pulse used to reset the pixel region to its activated state. In a further embodiment, display device 100 includes other photodetectors configured to sense light levels. For example, a photodetector determines light levels for purposes of illuminator brightness. Backflow detector 112 may also analyze the information from these photodetectors to determine a digital representation of the threshold level.

In an example embodiment, backflow detector 112 includes a comparator (see FIG. 6) that compares a photocurrent signal to a reference signal (or to ground) representing a threshold level to determine whether the photocurrent signal is higher or lower than the threshold level and output a digital "1" or "0" responsive to the comparison (e.g., "1" if the photocurrent signal is higher than the threshold level, and "0" if the photocurrent signal is lower than the threshold level).

Alternatively, backflow detector 112 may compare a photocurrent signal from first light sensing element 122 against a photocurrent signal from second light sensing element 124. First light sensing element 122 may be positioned in the pixel region or configured so that during a backflow event first light sensing element 122 is covered before second light sensing element 124 is covered (e.g., first light sensing element 122 is positioned closer to a side or a corner of the pixel to which the opaque oil collects when the pixel region is activated, referred to above as the activated location of the oil). If backflow detector 112 detects that the photocurrent signal from first light sensing element 122 (e.g., when first light sensing element is partially or fully covered by the opaque oil during backflow) is or becomes lower than the photocurrent signal from second light sensing element 124 (e.g., which is fully uncovered or less covered than first light sensing element 122), and if the difference exceeds a threshold, backflow detector 112 determines that a backflow event has occurred.

Backflow detector 112 may output a signal to timing controller 102 indicating that a backflow event has occurred and, in some embodiments, a location of the backflow event (e.g., an individual pixel region, a row of pixel regions, or a column of pixel regions where a backflow has been sensed). Timing controller 102 can then determine to perform a reset process on the affected pixel region (e.g., on an individual pixel region or on a collection of pixel regions such as a row or a column of pixel regions). In another embodiment, the functionality of backflow detector 112 is contained within and performed by timing controller 102. For example, timing controller 102 may include one or more analog-to-digital inputs which convert a sensed photocurrent signal into a digital value that timing controller 102 can use to determine the occurrence of a backflow event.

Figure 3:
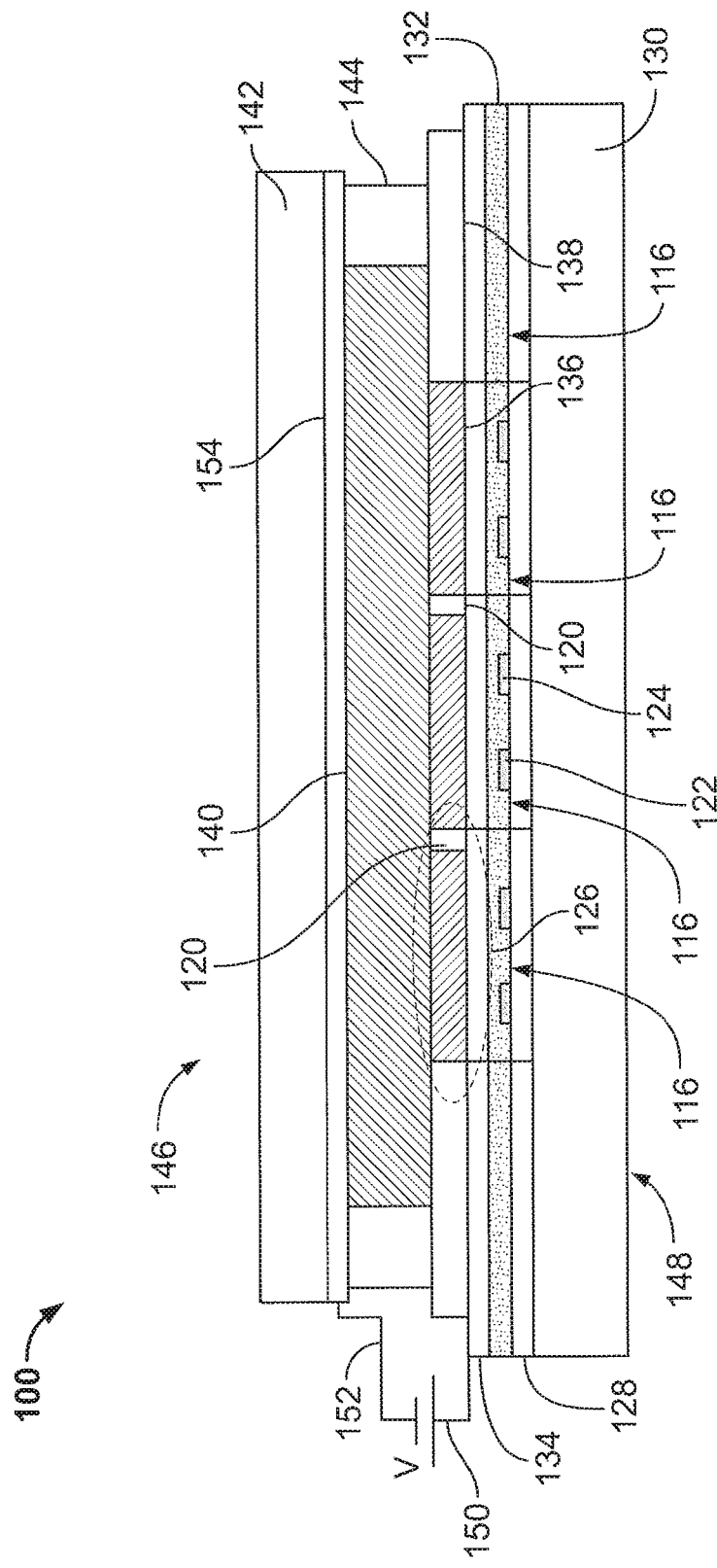
FIG. 3 is a cross-section of a portion of an electrowetting display device, according to various embodiments.

FIG. 3 is a cross-sectional view of a portion of electrowetting display device 100 showing details of several electrowetting pixels 126 that may each reside within one of pixel regions 114 of FIG. 2, according to some embodiments. A plurality of TFT structures 116, as shown in FIG. 2, is formed on a bottom support plate 130 and associated with each pixel region. In some implementations, a dielectric barrier layer 132 may at least partially separate an electrode layer 128 of TFT structure 116 from a hydrophobic layer 134 also formed over bottom support plate 130 and electrode layer 128. While optional, dielectric barrier layer 132 may act as a barrier that prevents electrolyte components (e.g., an electrolyte solution) from reaching electrode layer 128. Dielectric barrier layer 132 may comprise an inorganic layer, such as a silicon dioxide layer (e.g., about 0.2 micrometers thick), and an organic layer, such as polyimide layer (e.g., about 0.1 micrometers thick), though claimed subject matter is not so limited. In some embodiments, hydrophobic layer 134 includes a fluoropolymer, such as, for example, AF1600® fluoropolymer produced by DuPont based in Wilmington, Del.

As shown in FIG. 3, each TFT structure 116 includes light sensing element 122 and/or light sensing element 124. Light sensing elements 122, 124 are also electrically isolated from hydrophobic layer 134 by dielectric barrier layer 132. Top electrodes (not shown) made of ITO or a suitable transparent metal, for example, are formed on light sensing elements 122, 124. Electrical connections to the top electrodes may be made through the TFT structure or other electrical structures.

Pixel wall portions 120 form a patterned electrowetting pixel grid on hydrophobic layer 134, as can be seen in FIG. 2. Pixel wall portions 120 may comprise a photoresist material, such as, for example, an epoxy-based negative photoresist material SU-8. The patterned electrowetting pixel grid comprises rows and columns that form an electrowetting pixel array (e.g., electrowetting display panel 110). For example, an electrowetting pixel can have a width and length in a range of about 50 to 500 microns. A first liquid 136, which can have a thickness or depth in a range of about 1.0 to 10.0 micrometers, for example, overlies hydrophobic layer 134. First liquid 136 is generally an oil, often referred to as an electrowetting oil, and is partitioned by pixel wall portions 120 of the patterned electrowetting pixel grid. An outer rim 138 can comprise the same material as pixel wall portions 120. A second liquid 140, such as an electrolyte solution, overlies first liquid 136 and pixel wall portions 120 of the patterned electrowetting pixel grid.

As described above, second liquid 140 is substantially immiscible with first liquid 136. Second liquid 140 generally includes an electrolyte solution and is electrically conductive or polar. Second fluid 140 may be water or a salt solution, such as a solution of potassium chloride in a mixture of water and ethyl alcohol, for example. Second liquid 140 may be transparent or colored. First liquid 136 is electrically non-conductive and may for instance be an alkane like hexadecane or (silicone) oil. Hydrophobic layer 134 is arranged over bottom support plate 130 to create an electrowetting surface area within each pixel region 114. The hydrophobic character causes first liquid 136 to adhere preferentially to the surface of hydrophobic layer 134 because first liquid 136 has a higher wettability with respect to the surface of hydrophobic layer 134 than second liquid 140.

A top support plate 142 is positioned opposite bottom support plate 130. Top support plate 142 covers second liquid 140 and edge seals 144 retain second liquid 140 over the electrowetting pixel array. Bottom support plate 130 and top support plate 142 may be separate parts of individual electrowetting pixels or bottom support plate 130 and top support plate 142 may be shared by a plurality of electrowetting pixels. Bottom support plate 130 and top support plate 142 may be made of glass or polymer and may be rigid or flexible, for example.

A voltage V applied across second liquid 140 and electrode layer 128 of individual electrowetting pixels can control transmittance or reflectance of the individual electrowetting pixels. More particularly, in a number of embodiments, electrowetting display 100 may be a transmissive, reflective or transflective display that generally includes an array of pixels or pixels in pixel regions (e.g., the pixel regions 114 of FIG. 2) configured to be operated by an active matrix addressing scheme. For example, rows and columns of electrowetting pixels are operated by controlling voltage levels on a plurality of source lines (e.g., source lines D of FIG. 2) and gate lines (e.g., gate lines S of FIG. 2). In this fashion, electrowetting display device 100 may produce an image by selecting particular pixels to at least partly transmit, reflect or block light.

Electrowetting display device 100 has a viewing side 146 through which an image for display formed by the electrowetting display device 100 can be viewed, and a rear side 148. Top support plate 142 faces viewing side 146 and bottom support plate 130 faces rear side 148. Top support plate 142 is coupled to bottom support plate 130 with adhesive or sealing material 144. Electrowetting display device 100 may be a segmented display type in which the image is built up of segments. The segments can be switched simultaneously or separately. Each segment includes one electrowetting pixel 126 or a number of electrowetting pixels 126 that may be neighboring or distant from one another. Electrowetting pixels 126 included in one segment are switched simultaneously, for example. Electrowetting display device 100 may also be an active matrix driven display type or a passive matrix driven display, for example.

Electrode layer 128 (and thereby pixel electrodes 118) is supplied with voltage signals V by a first signal line 150 as will be further described herein. A second signal line 152 is electrically connected to a common electrode 154 that is in contact with conductive second liquid 140. Common electrode 154 may be common to more than one electrowetting pixel 126 because electrowetting pixels 126 are fluidly interconnected by and share second liquid 140 uninterrupted by pixel wall portions 120. Electrowetting pixels 126 are controlled by the voltage V applied between first signal line 150 and second signal line 152.

When the voltage V applied between first signal line 150 and second signal line 152 is set at a non-zero active signal level, electrowetting pixel 126 will enter into an active state. Electrostatic forces will move second liquid 140 toward electrode layer 128, thereby displacing first liquid 136 from the area of hydrophobic layer 134 towards one or more pixel wall portions 120 surrounding the area of hydrophobic layer 134, to form a droplet-like shape. This action uncovers first liquid 136 from the surface of hydrophobic layer 134 of electrowetting pixel 126. When the voltage across electrowetting pixel 126 is returned to an inactive signal level, electrowetting pixel 126 will return to an inactive state, and first liquid 136 flows back to cover hydrophobic layer 134. In this way, first liquid 136 forms an electrically controllable optical switch in each electrowetting pixel 126.

Generally, TFT structure 116 includes a gate electrode that is electrically connected to a corresponding scan line of the scan lines S, a source electrode that is electrically connected to a corresponding data line of the data lines D, and a drain electrode that is electrically connected to pixel electrode 118. Thus, electrowetting pixels 126 are operated, i.e., driving of electrowetting display 100, based upon the scan lines S and the data lines D of FIG. 2.

For driving of electrowetting displays via the scan lines S and the data lines D, a dedicated gate scanning algorithm may generally be implemented. The gate scanning algorithm generally defines an address timing for addressing rows of electrowetting pixels 126. Within each input frame, each row (corresponding to the scan lines S) of electrowetting pixels 126 within the electrowetting display 100 generally needs to be written twice. On occasion, the amount of writing can be more, depending on the actual drive scheme implementation. In general, the first write action discharges an electrowetting pixel 126 to a reset level, e.g., a black level voltage, which is also referred to as a reset of the pixel. The second write action generally charges the electrowetting pixel 126 to an actual required display data value. Often, electrowetting pixels 126 may need to be reset to maintain their appearance when the corresponding data value for a particular electrowetting pixels 126 does not change. This is especially true when the electrowetting display 100 is displaying a still image when all of electrowetting pixels 126 may need to be refreshed. Generally, during a reset process, timing controller 102 applies a reset signal to recharge electrowetting pixels 126 with corresponding display data values. For example, if an electrowetting pixel 126 is activated according to the display data value for that electrowetting pixel 126, timing controller 102 resets electrowetting pixel 126 by reapplying an activation voltage to electrowetting pixel 126. This causes the opaque oil in electrowetting pixel 126 to recollect at the appropriate corner or side, i.e., the activated position or location. However, if an electrowetting pixel 126 is not activated according to the display data value for that electrowetting pixel 126, timing controller 102 does not apply the reset signal to electrowetting pixel 126.

Figure 4:
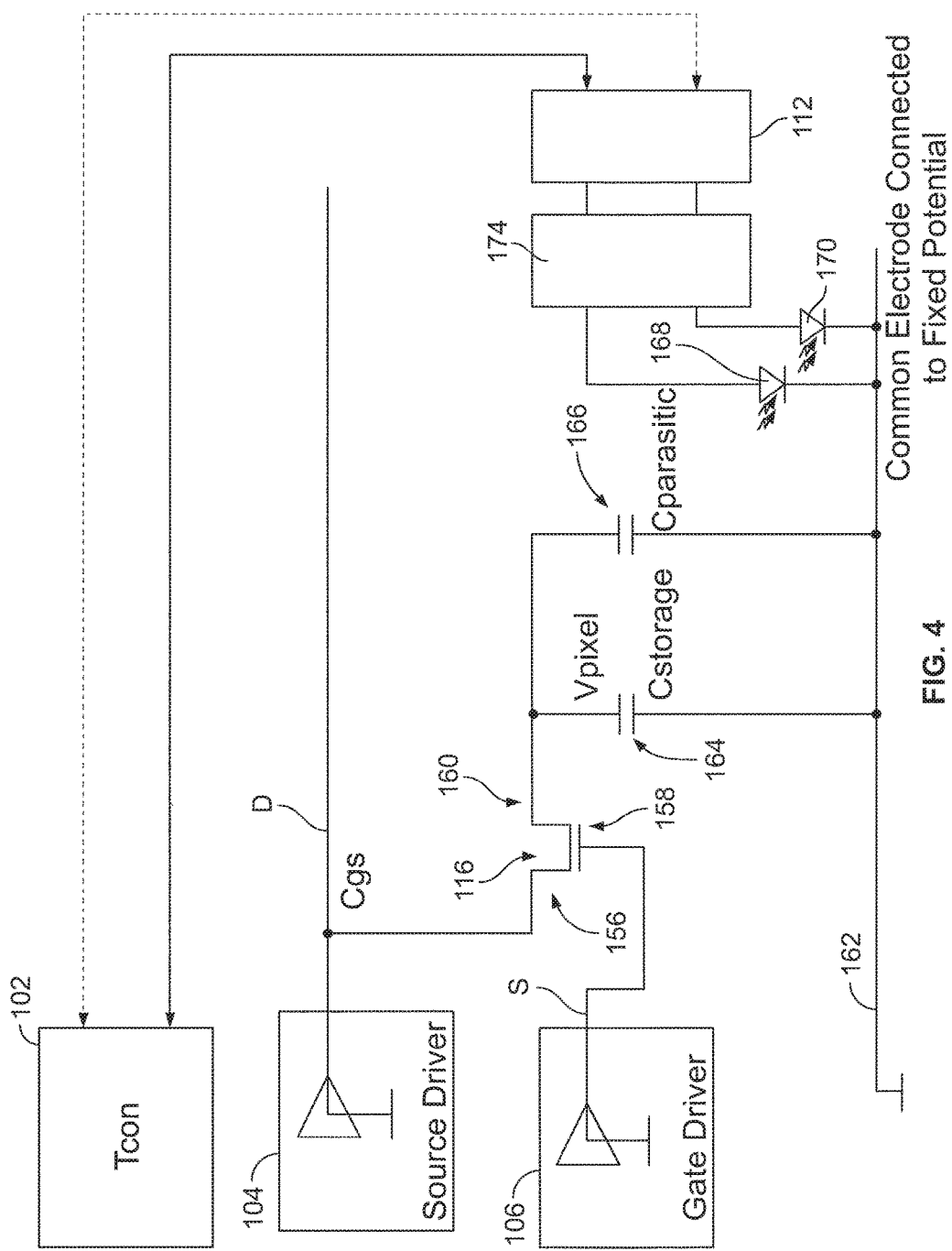
FIG. 4 is a schematic view representing circuitry for pixels within the electrowetting display of FIGS. 2 and 3, according to various embodiments.

FIG. 4 schematically illustrates an arrangement of thin film transistor (TFT) structure 116 for a pixel region 114 within electrowetting display 100. Each pixel region 114 within electrowetting display 100 generally includes such an arrangement. Source driver 104 is coupled to a data line D. The data line D is coupled to a source 156 of TFT structure 116 for pixel region 114. A scan line S is coupled to a gate 158 of TFT structure 116. The scan line S is coupled to a gate driver 106. A drain 160 of TFT structure 116 is coupled to a common line 162 that is coupled to a fixed potential of a common electrode (not illustrated) within electrowetting display 100. Common line 162 may also be coupled to ground. A storage capacitor 164 is provided between TFT structure 116 and common line 162. A variable parasitic capacitance, Cparasitic, is present in each pixel region 114 between drain 160 of TFT structure 116 and common line 162. The variable parasitic capacitance is represented by a variable capacitor 166.

Display device 100 is operated according to a drive scheme. The drive scheme is a collection of configuration settings (e.g., stored within a data file in a memory or storage system) that specifies certain values that are then used by the various components of electrowetting display 100 during operation. The settings can then be retrieved by various components of electrowetting display 100 and utilized by the components to control how the components operate. Alternatively, a processor or controller may retrieve values from the drive scheme and configure one or more other components of electrowetting display 100 (or, in fact, the processor or controller itself) in accordance with the values from the drive scheme.

Various drive schemes may store absolute values for particular configuration settings or, alternatively, ranges of values. For example, the drive scheme may specify the frequency at which timing controller 102 should operate as well as the frequency at which the pixels of electrowetting display 100 should be reset. The drive scheme may also specify the gate and source voltages (both high and low), frame rate, line time, clock frequency, reset voltage values, a number of sub-frames, common voltage, gain, gain factor, and the like. For example, the drive scheme may specify specific voltages values for both data signals D1, . . . , Dp−1, Dp, Dp+1, . . . , Dm and scan or gate signals S1, . . . , Sq−1, Sq, . . . , Sn or define how inputs from timing controller 102 are to be converted into data signals and gate signals having specific voltages. The drive scheme may also specify a particular common voltage Vcom to be supplied to display panel 110. With regards to the pixel write action described above, the drive scheme could also specify a particular voltage to be used when resetting a pixel. Similarly, the drive scheme may also specify a period of time or reset duration over which the reset voltage should be supplied to a particular pixel in order to sufficiently reset the pixel. The reset duration could be expressed in a number of seconds or, alternatively, as a number of addressing periods over which the pixel being reset should be subjected to the reset voltage. The drive scheme may also specify that a particular gate scanning algorithm is to be used by timing controller when addressing the various pixels of electrowetting display 100.

In general, a drive scheme may be optimized for a particular operating mode of electrowetting display 100. If, for example, electrowetting display 100 is being used to display text data, such a mode may not call for electrowetting display 100 to render information quickly or at a particularly high frame rate. In that case, an optimized drive scheme may call for the operating frequency of timing controller 102 to be reduced and the data signal and gate signal voltage values to be reduced to reduce power consumption of electrowetting display 100 while still providing sufficient display quality for a user to read the text information.

Although such a drive scheme may be well suited to the display of text data, the drive scheme may not be appropriate for the display of video data. In that case, a higher frame rate may be required and, as such, an appropriate drive scheme would call for increasing the operating frequency of timing controller 102 and potentially raising the data signal and gate signal voltage values to increase the rate at which the states of the display device's pixel can be set. These changes could allow the state of the pixels of electrowetting display 100 to change state quicker allowing for higher quality video rendering, but may result in increased power consumption and, thereby, shorter battery life and operating time.

FIG. 4 also shows the light sensing elements for a pixel region illustrated as first electrode photodiode 168 and second electrical photodiode 170. The cathodes of first photodiode 168 and second photodiode 170 are electrically coupled to a common electrode 162 with a fixed potential, while the anodes of first photodiode 168 and second photodiode 170 are coupled to a transducer 174. Transducer 174 may be tied to ground (e.g., across the inputs of an op amp or another potential that is lower than the fixed potential of common electrode 172. In this manner, first photodiode 168 and second photodiode 170 are situated in a reverse bias.

Photodiodes 168 and 170 develop a photocurrent that passes through photodiodes 168 and 170 in relation to the amount of light incident upon photodiodes 168 and 170 (e.g., more light results in a higher photocurrent). Transducer 174 measures the photocurrent through photodiodes 168 and 170 and outputs a photocurrent signal as a voltage relative to an amount of photocurrent through photodiodes 168 and 170. The photocurrent signal output from transducer 174 is passed to backflow detector 112 for the purpose of detecting an occurrence of a backflow event. Backflow detector 112 then sends one or more signals to timing controller 102 indicating the occurrence of a backflow event and/or the extent or the severity of the backflow event.

Figure 5:
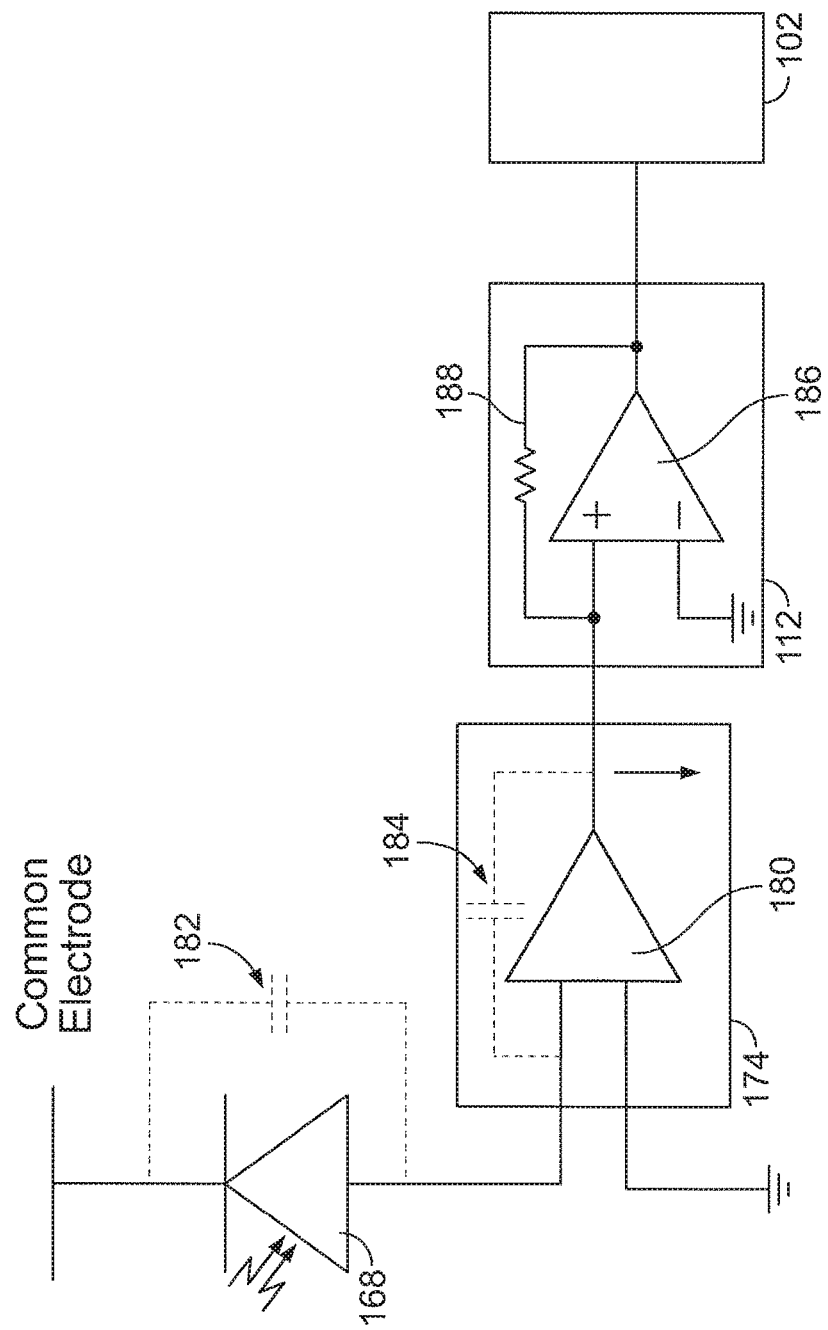
FIG. 5 is a schematic view representing circuitry for a transducer and a backflow detector, according to various embodiments.

FIG. 5 illustrates a schematic diagram of an example transducer 174 and backflow detector 112. In example embodiments, transducer 174 includes a transducer op amp 180. First photodiode 168 is shown with the cathode coupled to the common electrode and the anode coupled to one input of transducer op amp 180. The other input of transducer op amp 180 is connected to ground or another potential that is lower than the fixed potential of the common electrode, such that first photodiode 168 has a reverse bias. A photodiode capacitance 182 exists across photodiode 168. Transducer op amp 180 also includes an internal capacitance 184. Transducer op amp 180 converts the charge developed in first photodiode 168 (e.g., the photocurrent passed through first photodiode 168) into a voltage that is the photocurrent signal. In one embodiment, transducer op amp 180 is configured as a differential amplifier and the photocurrent signal voltage is a differential voltage. The differential voltage is dependent upon a rate of change of the photocurrent through first photodiode 168. For example, if the photocurrent remains steady (e.g., no backflow occurring), the differential voltage will be about zero volts. However, if the photocurrent begins to drop (e.g., indicating that the opaque oil is beginning to cover first photodiode 168 during a backflow event), the differential voltage will drop to a negative value. Backflow detector 112 detects that the differential voltage has dropped and will, thus, output a signal indicative of a backflow event.

Transducer 174 provides the photocurrent signal (e.g., differential voltage) to backflow detector 112. In one embodiment, backflow detector 112 is a comparator including comparator op amp 186 and a resistor 188 to form a comparator circuit. The photocurrent signal (e.g., differential voltage) is provided to one input of comparator op amp 186, while the other input of comparator op amp 186 is tied to ground or another potential. As discussed above, if the differential voltage drops below zero (e.g., indicating that the photocurrent through first photodiode 168 is decreasing), comparator op amp 186 outputs a signal indicating that the backflow event has occurred. The output signal is provided from backflow detector 112 to timing controller 102. Timing controller 102 recognizes a change of state of the output signal from backflow detector 112 and initiates a reset signal to associated pixel region 114 or an entire row or column of pixel regions in which associated pixel region 114 is situated.

Figure 6:
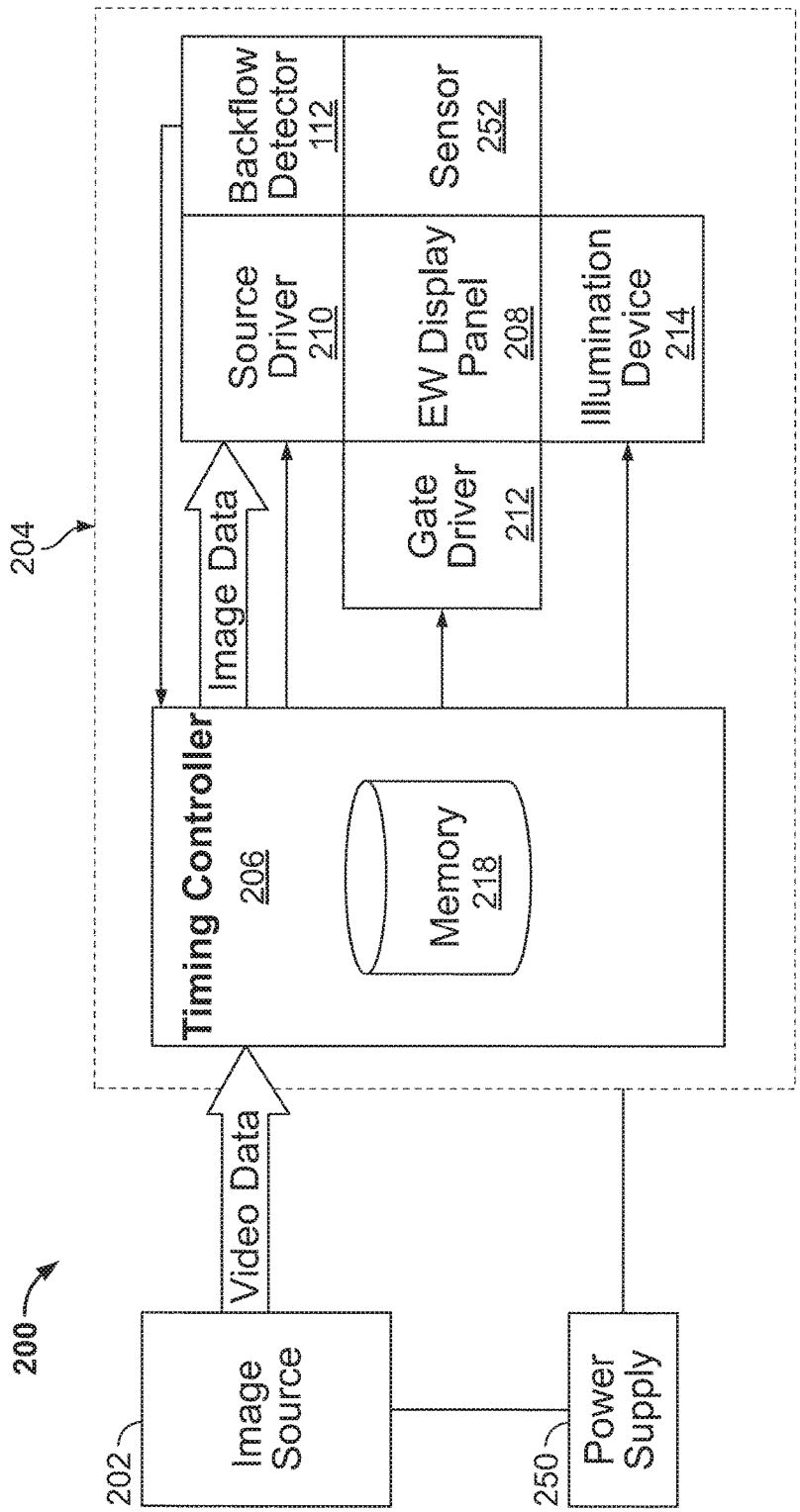
FIG. 6 schematically illustrates a simplified arrangement for a portion of an electronic device, according to various embodiments.

FIG. 6 schematically illustrates a simplified arrangement for a portion of an electronic display device 200 configured in accordance with the present disclosure to modify or update a drive scheme based upon a current operational mode of display device 200. Display device 200 comprises an image source 202, e.g., a graphic controller, and an electrowetting display 204 similar to electrowetting display 100. Electrowetting display 204 comprises a timing controller 206, an electrowetting display panel 208 (similar to electrowetting display panel 110 and thus, made up of rows and columns of pixel regions 114), a source driver 210 and a gate driver 212. Timing controller 206 generally corresponds to timing controller 102 of electrowetting display 100 and source driver 210 generally corresponds to source driver 104 of electrowetting display 100, while gate driver 212 generally corresponds to gate driver 106 of electrowetting display 100. Timing controller 206 controls source driver 210 and gate driver 212 using one or more addressing schemes that are included in timing controller 206 as either software or firmware in a memory, such as memory 218. Electronic display device 200 may also include backflow detector 112 that receives and processes the photocurrent signal to determine the occurrence of a backflow event. Alternatively, the functionality of backflow detector 112 may be included and implemented within timing controller 206.

An illumination device 214 is coupled to display device 200 and configured to illuminate at least a portion of display panel 208 and the pixels therein. If display panel 208 is implemented as an array of transmissive pixels, illumination device 214 may be implemented as a back light. In which case, when activated, illumination device 214 causes light to pass through the open pixels of display panel 208 to a viewer. Conversely, if display panel 208 is implemented as an array of reflective pixels, illumination device 214 may be implemented as a front light. In which case, when activated, illumination device 214 causes light to strike the viewing surface of display panel 208 and be reflected back out of open pixels to a viewer. Illumination device 214 may be implemented using any appropriate light generating devices, such as an LED or an array of LEDs. Light sensing elements 122, 124 may be configured to detect the light from illumination device 214, wherein the opaque oil of the pixel region may occlude all or part of light sensing elements 122, 124 from the light from illumination device 214 during a backflow event.

Display device 200 includes a power supply 250 configured to supply electrical energy to one or more of the components of display device 200. Power supply 250 may include, for example, a battery in combination with one or more power supply controller. Display device 200 may also include a sensor 252 configured to measure an attribute of one or more components of display device 200. For example, sensor 252 may include a temperature sensor configured to detect a temperature of one or more device components. In that case, sensor 252 may include any suitable temperature sensor, such as a thermocouple, thermistor, or resistance temperature detector. Sensor 252 could also include a voltage sensor, for example, configured to measure a voltage across one or more components of display device 200. For example, a voltage sensor may measure a voltage across one or more pixel capacitors within display device 200 (e.g., the voltage across variable capacitance 164 depicted in FIG. 4).

Memory 218 is configured to store a drive scheme for display device 200, though in various embodiments any suitable memory store may be utilized to store a drive scheme for display device 200. The drive scheme may be implemented as a configuration file setting forth a number of settings that determine how the various components of display device 200 operate. In general, the drive scheme may include settings for every component of display device 200, though in various embodiments, the drive scheme only sets forth a subset of potential settings for a subset of components of display device 200. In that case, to the extent a component of display device 200 requires a setting to operate that is not defined in the drive scheme, that component may be pre-loaded with a fixed setting, rather than retrieve the setting from the drive scheme. In addition to a drive scheme, memory 218 may store additional configuration data, such as a mode of operation of a network communications device of display device 200 (e.g., what communication protocols are currently enabled for the communications device, and the like). Memory 218 may also store settings that specify whether display device 200 is operating in a full color or black and white display mode, for example, and information describing how display device 200 is currently being utilized (e.g., whether display device 200 is being used to display text content, display video, or play video games).

Figure 7:
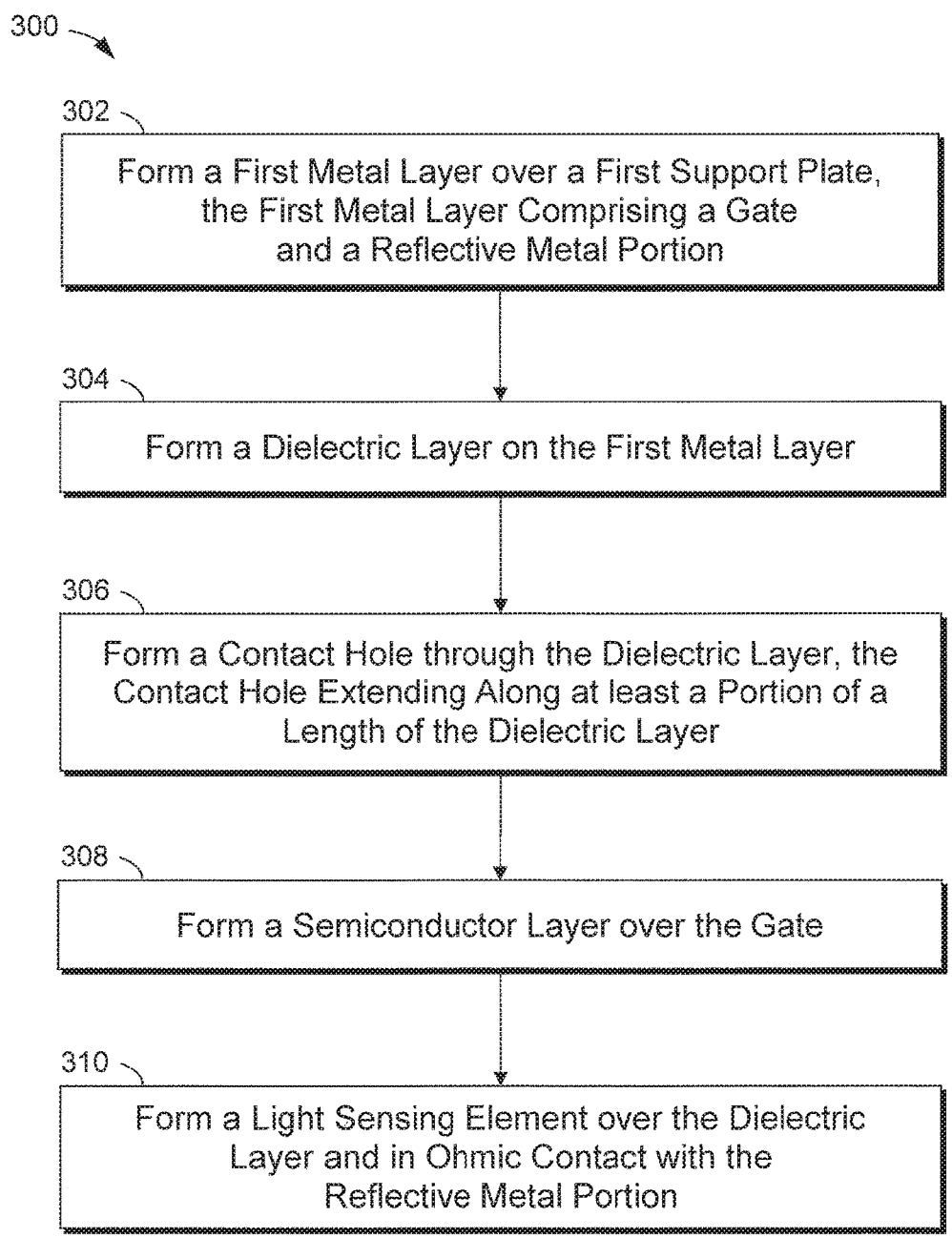
FIG. 7 is a flowchart illustrating an example method for fabricating at least a portion of an electrowetting display device, according to various embodiments.

As described above, in an electrowetting display, backflow is a tendency of the fluids within an electrowetting pixel, even when subjected to constant electrostatic forces, to return to their original resting condition. This tendency, therefore, causes the electrowetting pixel to gradually reduce its light throughput over time as the first fluid returns to its resting position covering the entire pixel. Various variables can affect the backflow phenomenon within an electrowetting display device include the voltage and time duration specified for the reset process as well as the pixel's common voltage. A backflow event occurs when a fluid (e.g., the opaque oil) returns a certain percentage toward its original resting condition (e.g., 10%, 20%, 30%, etc.). Alternatively, in the example embodiments, a backflow event occurs when the opaque oil moves to physically cover or occlude a certain amount or area of the light sensing element such that a photocurrent signal is reduced below a threshold value. Alternatively, a backflow event occurs when the photocurrent through first photodiode 168 begins to drop, indicating the opaque oil has begun to cover a portion of first photodiode 168. FIG. 7 is a flowchart illustrating a method 300 for fabricating at least a portion of an electrowetting display device including a plurality of TFT structures, e.g., TFT structures 22, each associated with a pixel within a respective pixel region formed over the first support plate. At step 302, a first metal layer is formed over, e.g., deposited on, a first support plate, such as bottom support plate 14. The first metal layer includes a gate and a reflective portion, such as a reflective metal portion. A suitable first passivation layer, e.g., a dielectric layer, is formed 304 on, e.g., deposited on, the first metal layer and a contact hole is formed 306 through the dielectric layer using a suitable method known in the art. For example, in certain embodiments, the dielectric layer is patterned to form one or more contact holes through a thickness of the dielectric layer. The contact hole extends along at least a portion of a length of the dielectric layer. At step 308, a semiconductor layer is formed over, deposited on, the gate. In example embodiments, the semiconductor layer includes an active amorphous silicon.

A light sensing element is formed 310 over the dielectric layer and in ohmic contact with the reflective metal portion. In one embodiment, forming 310 a light sensing element over the dielectric layer and in ohmic contact with the reflective metal portion includes forming an amorphous silicon layer at least partially in the contact hole and extending along at least a portion of the length of the dielectric layer such that the amorphous silicon layer contacts or is coupled to the first metal layer. A top electrode of the light sensing element is formed over the amorphous silicon layer. In example embodiments, the top electrode includes a transparent ITO layer deposited on the amorphous silicon layer and, in certain embodiments, configured to overlap an edge of the dielectric layer surrounding the contact hole, as shown in FIG. 1.

In a particular embodiment, forming an amorphous silicon layer in the contact hole and extending along at least a portion of the length of the dielectric layer includes depositing a photoresist material at least partially in the contact hole. The photoresist material is patterned through a mask to form a patterned photoresist material. The patterned photoresist material is then developed to form the amorphous silicon layer. In a particular embodiment, forming a top electrode of the light sensing element includes forming a transparent indium tin oxide (ITO) layer on the amorphous silicon layer.

In example embodiments, method 300 includes forming, e.g., depositing, a second passivation layer, e.g., passivation layer 42, including a silicon nitride layer, for example, on the light sensing element. In a particular embodiment, a suitable silicon nitride material is deposited on the top electrode of the light sensing element and patterned to isolate the top electrode from the pixel electrode associated with the respective pixel region. A second metal layer including, for example, a transparent ITO layer, is formed on the semiconductor layer and the second passivation layer. In a particular embodiment, the transparent ITO layer includes a source and a drain. A third passivation layer, e.g., passivation layer 50, including a silicon nitride layer, for example, is formed, e.g., deposited, on the transparent ITO layer and a second contact hole extends through the third passivation layer. For example, in certain embodiments, the third passivation layer is patterned to form the second contact hole through a thickness of the third passivation layer. A transparent pixel electrode is formed over the drain on the third passivation layer. The transparent pixel electrode extends through the second contact hole to electrically couple to the drain.

In example embodiments, a timing controller is operatively coupled to the light sensing element. The timing controller is configured to receive a photocurrent signal from the light sensing element representative of a photocurrent generated between a top electrode of the light sensing element and the reflective metal portion corresponding to an amount of light incident on the light sensing element.

Figure 8:
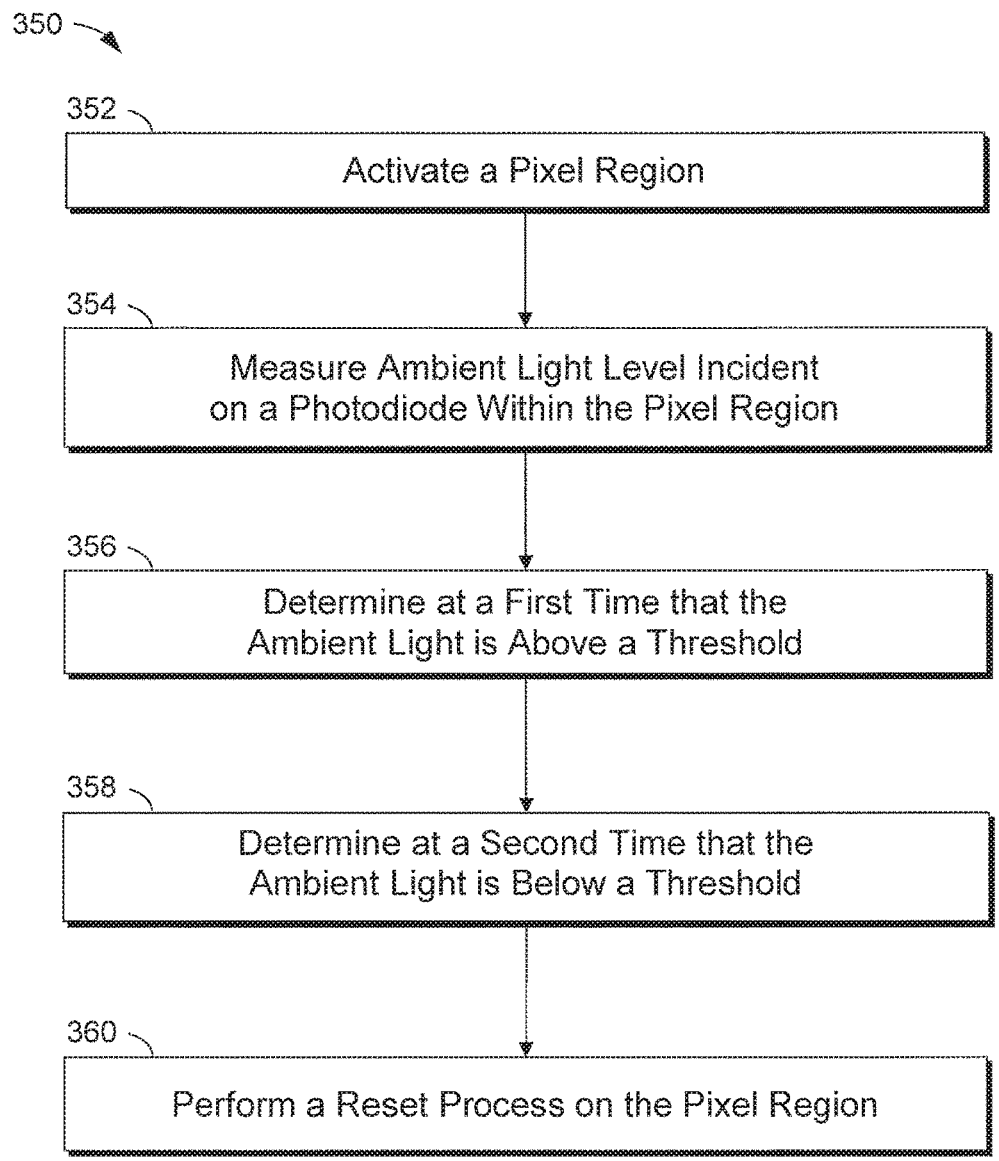
FIG. 8 is a flowchart illustrating an example method for optimizing a drive scheme of an electrowetting display device, according to various embodiments.

FIG. 8 is a flowchart illustrating a method 350 of resetting pixel regions of an electrowetting display device subject to backflow. At step 352, timing controller 102 activates an electrowetting pixel region. Activation of the pixel region may be due to displaying an image on the electrowetting display, wherein the image data for the image indicates that the pixel region should be activated (e.g., such that the opaque oil is collected at the side or a corner). At step 354, timing controller 102 and/or backflow detector 112 measures a level of light incident on a photodiode within the electrowetting pixel region. In various embodiments, the photodiode is the light sensing elements 122, 124 discussed above with reference to FIG. 1. As light impinges on the photodiode, the photodiode will generate a photocurrent, and the light level of light incident on the photodiode is related to the photocurrent. As such, the value of the photocurrent signal is related to an amount of backflow of the opaque oil within the electrowetting pixel region.

The photodiode is configured to be at least partially covered by the opaque oil to inhibit light incident on the photodiode. For example, the photodiode will be entirely or mostly covered when the pixel region is deactivated and the opaque oil returns to its resting position. However, the photodiode will be entirely or mostly uncovered when the pixel region is activated and the opaque oil collects at an edge or corner. During a backflow event, the opaque oil will spread out from the initial activated collected location back toward its resting location, thereby increasing the amount of the area of the photodiode that is covered by the opaque oil over time.

At step 356, timing controller 102 or backflow detector 112 determines at a first time that the light level is above a light level threshold. For example, timing controller 102 or backflow detector 112 will receive a photocurrent signal representative of the photocurrent generated by the photodiode (e.g., the light sensing element) and will compare the value of the photocurrent signal to a threshold value to determine that it is above the threshold value (e.g., 20%, 30%, or 40% of a maximum photocurrent signal, or another value). Alternatively, timing controller 102 or backflow detector 112 will determine that the value of the photocurrent signal is within an acceptable range (e.g., between 100% and 20% of a maximum photocurrent signal, or between 100% and 30% or 40%; other values are possible). By determining that the photocurrent signal is above a threshold or within an acceptable range, timing controller 102 or backflow detector 112 determines that a backflow event has not occurred, or more specifically, that backflow has not occurred to the extent necessary to trigger a reset of the pixel region.

At step 358, however, the backflow reaches a critical amount and timing controller 102 or backflow detector 112 determines at a second time, later than the first time, that the light level is below the light level threshold caused by backflow of the opaque oil. For example, the opaque oil has flowed enough to cover or occlude the photodiode to such an extent such that its photocurrent is reduced below an acceptable threshold, or is outside of an acceptable range (see ranges above or other ranges). As such, timing controller 102 or backflow detector 112 determines that a backflow event has occurred for that pixel region and that a reset process should be initiated to recollect the opaque oil to its activated state or location. Thus, at step 360, in response to determining that the light level is below the light level threshold (e.g., that the photocurrent signal value is below the threshold or is outside of an acceptable range), timing controller 102 initiates and/or performs a reset process on the electrowetting pixel region.

In an alternative embodiment, backflow detector 112 receives a photocurrent signal including a differential voltage representative of a change in the photocurrent generated by the photodiode. Backflow detector 112 compares the photocurrent signal to a threshold value (e.g., zero). If backflow detector 112 determines that the photocurrent signal is below zero, backflow detector 112 outputs a signal to timing controller 102 indicating that a backflow event has occurred. Timing controller 102 then initiates the reset process on the affected pixel region.

Variations of the above method are possible. For example, timing controller 102 may perform a reset process on an entire row or column (or multiple pixel regions in a row or column) of electrowetting pixel regions, which row or column includes the electrowetting pixel region subject to the backflow, responsive to determining at the second time that the light level is below the light level threshold caused by backflow of the opaque oil. In another approach, the method includes measuring light levels at multiple electrowetting pixel regions of the row or column of electrowetting pixel regions and determining an average of the light levels for the row or column of electrowetting pixel regions. Further, the method includes timing controller 102 or backflow detector 112 determining that the average of the light levels indicates a backflow event has occurred in at least one electrowetting pixel region of the row or column of electrowetting pixel regions. In response, timing controller 102 can perform a reset process on the row or column of electrowetting pixel regions. In another embodiment, each electrowetting pixel region of the row or column of electrowetting pixel regions includes a photodiode. Timing controller 102 or backflow detector 112 is further configured to receive a plurality of photocurrent signals representative of the photocurrent in each photodiode of each electrowetting pixel region of the row of electrowetting pixel regions. Timing controller 102 or backflow detector 112 may determine an average of the light levels of the plurality of photocurrent signals for the row or column of electrowetting pixel regions, and determine that the average of the light levels of the plurality of photocurrent signals indicates a backflow event has occurred in at least one electrowetting pixel region of the row of electrowetting pixel regions. For example, the average of the light levels may fall outside of an acceptable range or below a threshold value. Responsively, timing controller 102 may perform a reset process on the row or column.

In another embodiment, the method includes measuring a second light level of light incident on a second photodiode (e.g., a second light sensing element spaced from the first light sensing element) within the electrowetting pixel region, determining at the first time that the second light level is above the light level threshold and determining at the second time that the second light level is below the light level threshold caused by backflow of the opaque oil. In response, timing controller 102 can perform the reset process on the electrowetting pixel region. In certain embodiments, the photocurrents from the first photodiode and the second photodiode are combined such that the photocurrent signal represents both photocurrents.

In another embodiment, timing controller 102 or backflow detector 112 is further configured to determine that the electrowetting pixel region is currently activated, and responsively determine that the value of the photocurrent signal indicates a backflow event has occurred. In another example, conversely, timing controller 102 or backflow detector 112 may skip the process of analyzing the photocurrent signal for a pixel region if it determines that the pixel region is supposed to be deactivated, e.g., such that the opaque oil is in its resting state or position (covering the photodiodes) wherein backflow is not an issue.

Further, in various embodiments, timing controller 102 can vary the width or the timing of a reset signal responsive to the light level sensed by the photodiode. For example, timing controller 102 can vary a duration of application of a reset pulse applied to a pixel region or a row or a column of pixel regions according an extent of backflow detected by backflow detector 112. For example, timing controller 102 can apply a longer reset pulse if more backflow has occurred or a shorter reset pulse if less backflow has occurred. This variation saves power by only applying the reset pulse for the duration needed according to the sensed backflow conditions. The reset pulse may be between, for example, 0.5 millisecond and 5.0 milliseconds, in various embodiments. Similarly, timing controller 102 can vary a frequency of application of the reset pulse according to the sensed backflow conditions. For example, if backflow occurs at a slower rate, then timing controller 102 may apply the reset signal with a lower frequency, while timing controller 102 may apply the reset signal with a higher frequency if backflow occurs at a quicker rate. For example, timing controller 102 may apply the reset signal for a given pixel region with a frequency between 5 Hz and 60 Hz, though lower and higher frequencies may be possible. Thus, timing controller 102 applies the reset signal with a variable frequency (e.g., as needed), which saves power over an ad hoc application of a reset signal at a constant frequency.

Figure 9:
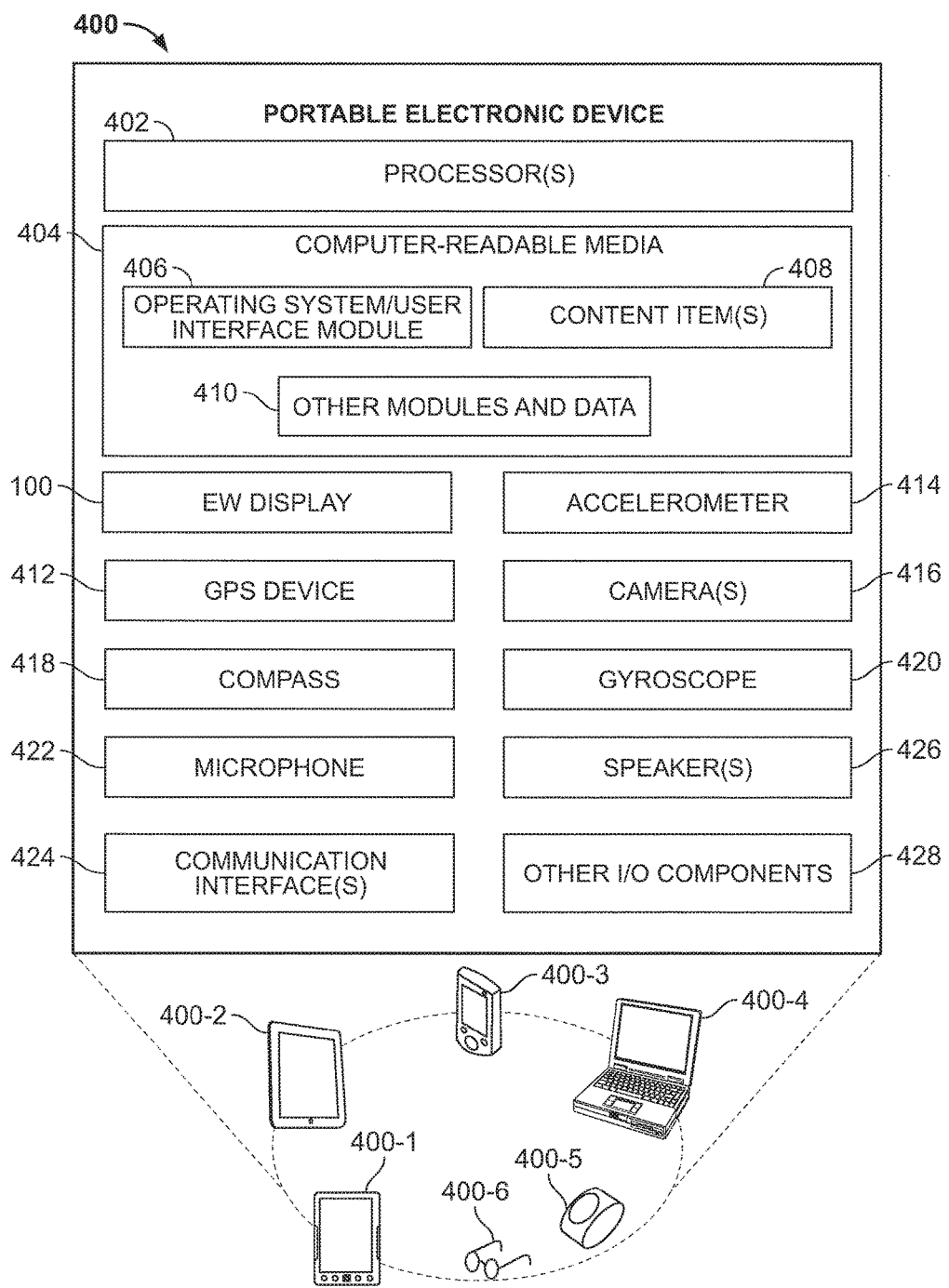
FIG. 9 illustrates select components of an example image display apparatus that may include an electrowetting display, according to various embodiments.

FIG. 9 illustrates select example components of an example image display apparatus 400 that may be used with electrowetting display device 100 according to some implementations. Other types of displays may also be used with the example image display apparatus 400. Such types of displays include, but are not limited to, LCDs, cholesteric displays, electrophoretic displays, electrofluidic pixel displays, photonic ink displays, and the like.

Image display apparatus 400 may be implemented as any of a number of different types of electronic devices. Some examples of image display apparatus 400 may include digital media devices and eBook readers 400-1; tablet computing devices 400-2; smart phones, mobile devices and portable gaming systems 400-3; laptop and netbook computing devices 400-4; wearable computing devices 400-5; augmented reality devices, helmets, goggles or glasses 400-6; and any other device capable of connecting with electrowetting display device 100 and including a processor and memory for controlling the display according to the techniques described herein.

In a very basic configuration, image display apparatus 400 includes, or accesses, components such as at least one control logic circuit, central processing unit, or processor 402, and one or more computer-readable media 404. Each processor 402 may itself comprise one or more processors or processing cores. For example, processor 402 can be implemented as one or more microprocessors, microcomputers, microcontrollers, digital signal processors, central processing units, state machines, logic circuitries, and/or any devices that manipulate signals based on operational instructions. In some cases, processor 402 may be one or more hardware processors and/or logic circuits of any suitable type specifically programmed or configured to execute the algorithms and processes described herein. Processor 402 can be configured to fetch and execute computer-readable instructions stored in computer-readable media 404 or other computer-readable media. Processor 402 can perform one or more of the functions attributed to timing controller 102, source driver 104, and/or gate driver 106 of electrowetting display device 100. Processor 402 can also perform one or more functions attributed to a graphic controller (not illustrated) for the electrowetting display device.

Depending on the configuration of image display apparatus 400, computer-readable media 404 may be an example of tangible non-transitory computer storage media and may include volatile and nonvolatile memory and/or removable and non-removable media implemented in any type of technology for storage of information such as computer-readable instructions, data structures, program modules or other data. Computer-readable media 404 may include, but is not limited to, RAM, ROM, EEPROM, flash memory or other computer readable media technology, CD-ROM, digital versatile disks (DVD) or other optical storage, magnetic cassettes, magnetic tape, solid-state storage and/or magnetic disk storage. Further, in some cases, image display apparatus 400 may access external storage, such as RAID storage systems, storage arrays, network attached storage, storage area networks, cloud storage, or any other medium that can be used to store information and that can be accessed by processor 402 directly or through another computing device or network. Accordingly, computer-readable media 404 may be computer storage media able to store instructions, modules or components that may be executed by processor 402.

Computer-readable media 404 may be used to store and maintain any number of functional components that are executable by processor 402. In some implementations, these functional components comprise instructions or programs that are executable by processor 402 and that, when executed, implement operational logic for performing the actions attributed above to image display apparatus 400. Functional components of image display apparatus 400 stored in computer-readable media 404 may include the operating system and user interface module 406 for controlling and managing various functions of image display apparatus 400, and for generating one or more user interfaces on electrowetting display device 100 of image display apparatus 400.

In addition, computer-readable media 404 may also store data, data structures and the like, that are used by the functional components. For example, data stored by computer-readable media 404 may include user information and, optionally, one or more content items 408. Depending on the type of image display apparatus 400, computer-readable media 404 may also optionally include other functional components and data, such as other modules and data 410, which may include programs, drivers and so forth, and the data used by the functional components. Further, image display apparatus 400 may include many other logical, programmatic and physical components, of which those described are merely examples that are related to the discussion herein. Further, while the figures illustrate the functional components and data of image display apparatus 400 as being present on image display apparatus 400 and executed by processor 402 on image display apparatus 400, it is to be appreciated that these components and/or data may be distributed across different computing devices and locations in any manner.

FIG. 9 further illustrates examples of other components that may be included in image display apparatus 400. Such examples include various types of sensors, which may include a GPS device 412, an accelerometer 414, one or more cameras 416, a compass 418, a gyroscope 420, a microphone 422, and so forth.

Image display apparatus 400 may further include one or more communication interfaces 424, which may support both wired and wireless connection to various networks, such as cellular networks, radio, Wi-Fi networks, close-range wireless connections, near-field connections, infrared signals, local area networks, wide area networks, the Internet, and so forth. Communication interfaces 424 may further allow a user to access storage on or through another device, such as a remote computing device, a network attached storage device, cloud storage, or the like.

Image display apparatus 400 may further be equipped with one or more speakers 426 and various other input/output (I/O) components 428. Such I/O components 428 may include a touchscreen and various user controls (e.g., buttons, a joystick, a keyboard, a keypad, etc.), a haptic or tactile output device, connection ports, physical condition sensors, and so forth. For example, operating system 406 of image display apparatus 400 may include suitable drivers configured to accept input from a keypad, keyboard, or other user controls and devices included as I/O components 428. Additionally, image display apparatus 400 may include various other components that are not shown, examples of which include removable storage, a power source, such as a battery and power control unit, a PC Card component, and so forth.

Various instructions, methods and techniques described herein may be considered in the general context of computer-executable instructions, such as program modules stored on computer storage media and executed by the processors herein. Generally, program modules include routines, programs, objects, components, data structures, etc., for performing particular tasks or implementing particular abstract data types. These program modules, and the like, may be executed as native code or may be downloaded and executed, such as in a virtual machine or other just-in-time compilation execution environment. Typically, the functionality of the program modules may be combined or distributed as desired in various implementations. An implementation of these modules and techniques may be stored on computer storage media or transmitted across some form of communication.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications can be made, and equivalents can be substituted, without departing from claimed subject matter. Additionally, many modifications can be made to adapt a particular situation to the teachings of claimed subject matter without departing from the central concept described herein. Therefore, it is intended that claimed subject matter not be limited to the particular embodiments disclosed, but that such claimed subject matter can also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter can be practiced without these specific details. In other instances, methods, devices, or systems that would be known by one of ordinary skill have not been described in detail so as not to obscure claimed subject matter.

Reference throughout this specification to "one embodiment" or "an embodiment" can mean that a particular feature, structure, or characteristic described in connection with a particular embodiment can be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described can be combined in various ways in one or more embodiments. In general, of course, these and other issues can vary with the particular context of usage. Therefore, the particular context of the description or the usage of these terms can provide helpful guidance regarding inferences to be drawn for that context.

What is claimed is:

1. An electrowetting display device, comprising:
   a first support plate and an opposing second support plate;
   an electrowetting pixel region between the first support plate and the second support plate; and
   a thin film transistor (TFT) structure over the first support plate and associated with the electrowetting pixel region, the TFT structure comprising:
      a first metal layer over the first support plate, the first metal layer comprising a gate and a reflective metal portion;
      a semiconductor layer over the gate;
      a dielectric layer on the first metal layer, the dielectric layer comprising a first contact hole, the first contact hole extending along at least a portion of a length of the dielectric layer; and
      a first light sensing element disposed over the dielectric layer and in ohmic contact with the reflective metal portion, the first light sensing element comprising:
         an amorphous silicon layer disposed over the first contact hole and extending along at least a portion of the length of the dielectric layer;
         a transparent first indium tin oxide (ITO) layer disposed over the amorphous silicon layer, the transparent first ITO layer forming a top electrode of the first light sensing element; and
         a photodiode configured to generate a photocurrent between the transparent first ITO layer and the reflective metal portion corresponding to an amount of light incident on the photodiode; and
   a timing controller coupled to the photodiode, the timing controller configured to:
      receive a photocurrent signal from the photodiode representative of the photocurrent;
      determine that a value of the photocurrent signal is below a threshold value; and
      apply a reset signal to the electrowetting pixel region to recharge the electrowetting pixel region with a display data value, wherein opaque oil in the electrowetting pixel region in an activated location exposes at least a portion of the photodiode.

2. The electrowetting display device of claim 1, wherein the TFT structure further comprises:
   a first passivation layer disposed on the top electrode;
   a transparent second ITO layer on the semiconductor layer and the first passivation layer, the transparent second ITO layer comprising a source and a drain;
   a second passivation layer on the transparent second ITO layer, a second contact hole extending through the second passivation layer; and
   a transparent pixel electrode disposed on the second passivation layer, the transparent pixel electrode extending through the second contact hole to electrically couple to the drain.

3. The electrowetting display device of claim 1, further comprising a row of electrowetting pixel regions comprising the electrowetting pixel region, wherein each electrowetting pixel region of the row of electrowetting pixel regions comprises a photodiode, the timing controller is configured to receive a photocurrent signal from the photodiode of each electrowetting pixel region representative of the photocurrent in the photodiode.

4. The electrowetting display device of claim 3, wherein the timing controller is configured to apply a reset signal to each electrowetting pixel region in the row of electrowetting pixel regions responsive to determining that the value of the photocurrent signal is below a threshold value.

5. The electrowetting display device of claim 4, wherein the timing controller is configured to:
   determine an average of a plurality of photocurrent signals received from the photodiode of each electrowetting pixel region in the row of electrowetting pixel regions;
   determine that the average of the plurality of photocurrent signals indicates a value of the photocurrent signal from at least one electrowetting pixel region of the row of electrowetting pixel regions is below the threshold value; and
   apply the reset signal to each electrowetting pixel region in the row of electrowetting pixel regions responsive to determining that the average of the plurality of photocurrent signals indicates a value of the photocurrent signal from at least one electrowetting pixel region of the row of electrowetting pixel regions is below the threshold value.

6. The electrowetting display device of claim 1, wherein the electrowetting pixel region further comprises an additional photodiode spaced from the photodiode, the additional photodiode configured to generate an additional photocurrent, wherein the timing controller is coupled to the additional photodiode and is configured to receive the photocurrent signal representative of the photocurrent and the additional photocurrent and vary one or more of the following: a duration of a reset pulse corresponding to the reset signal or a frequency of the reset pulse based at least in part on the photocurrent signal.

7. The electrowetting display device of claim 1, wherein the photocurrent signal is a voltage corresponding to the photocurrent through the photodiode.

8. The electrowetting display device of claim 1, wherein the timing controller is further configured to vary at least one of a width of the reset signal or a timing of the reset signal responsive to the value of the photocurrent signal.

* * * * *